(12) United States Patent
Kim et al.

(10) Patent No.: US 10,944,943 B2
(45) Date of Patent: Mar. 9, 2021

(54) IMAGE SENSOR INCLUDING A TRANSPARENT CONDUCTIVE LAYER IN A TRENCH

(71) Applicant: Samsung Electronics Co., Ltd., Suwon-si (KR)

(72) Inventors: Sang-Hoon Kim, Seongnam-si (KR); Byungjun Park, Yongin-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/392,916

(22) Filed: Apr. 24, 2019

(65) Prior Publication Data

US 2020/0077055 A1 Mar. 5, 2020

(30) Foreign Application Priority Data

Aug. 29, 2018 (KR) .................. 10-2018-0101918

(51) Int. Cl.
*H04N 9/04* (2006.01)
*H04N 5/374* (2011.01)
*H04N 5/357* (2011.01)
*H04N 5/378* (2011.01)

(52) U.S. Cl.
CPC ......... *H04N 9/0455* (2018.08); *H04N 5/3577* (2013.01); *H04N 5/378* (2013.01); *H04N 5/3741* (2013.01)

(58) Field of Classification Search
CPC .................................................. H04N 9/0455
See application file for complete search history.

(56) References Cited

U.S. PATENT DOCUMENTS

| 7,875,948 | B2 | 1/2011 | Hynecek et al. |
| 8,183,603 | B2 | 5/2012 | Yamaguchi et al. |
| 9,509,929 | B2* | 11/2016 | Ohgishi ............. H01L 27/1462 |
| 9,683,890 | B2 | 6/2017 | Skorka et al. |
| 9,905,615 | B2 | 2/2018 | Lee et al. |
| 10,204,964 | B1* | 2/2019 | Lee .................. H01L 27/14638 |
| 2002/0020846 | A1 | 2/2002 | Pi et al. |
| 2006/0187327 | A1* | 8/2006 | Mabuchi ............. H01L 27/1464 348/294 |
| 2012/0242874 | A1* | 9/2012 | Noudo ............. H01L 27/14623 348/294 |
| 2014/0035082 | A1* | 2/2014 | Chu .................. H01L 27/14692 257/432 |
| 2016/0269668 | A1 | 9/2016 | Oshiyama et al. |
| 2017/0062496 | A1* | 3/2017 | Lai .................... H01L 27/14645 |
| 2017/0154917 | A1 | 6/2017 | Lu et al. |
| 2017/0243912 | A1* | 8/2017 | Kaneda ............... H04N 5/3696 |
| 2019/0131349 | A1* | 5/2019 | Im ..................... H01L 27/14634 |
| 2019/0157324 | A1* | 5/2019 | Watanabe ......... H01L 27/14627 |
| 2019/0221601 | A1* | 7/2019 | Huang ............... H01L 27/1464 |
| 2019/0252466 | A1* | 8/2019 | Yoo .................. H01L 27/14665 |
| 2020/0006410 | A1* | 1/2020 | Wu ................... H01L 27/14685 |

(Continued)

*Primary Examiner* — Cynthia Segura
(74) *Attorney, Agent, or Firm* — Myers Bigel, P.A.

(57) ABSTRACT

An image sensor is disclosed. The image sensor includes a substrate including an active region and a dummy region, a plurality of unit pixels on the active region, a transparent conductive layer on a first surface of the substrate, a light-blocking layer on the transparent conductive layer and electrically connected to the transparent conductive layer, the light-blocking layer having a grid structure adjacent light transmission regions, and a pad electrically connected to the light-blocking layer, on the dummy region.

19 Claims, 22 Drawing Sheets

(56) References Cited

U.S. PATENT DOCUMENTS

2020/0021754 A1\* 1/2020 Borthakur ......... H01L 27/14645
2020/0106978 A1\* 4/2020 Nozawa ............ H01L 27/14665
2020/0127025 A1\* 4/2020 Lim .................. H01L 27/14623

\* cited by examiner

IMAGE SENSOR INCLUDING A TRANSPARENT CONDUCTIVE LAYER IN A TRENCH

CROSS-REFERENCE TO RELATED APPLICATIONS

This U.S. non-provisional patent application claims priority under 35 U.S.C. § 119 to Korean Patent Application No. 10-2018-0101918, filed on Aug. 29, 2018, in the Korean Intellectual Property Office, the entire contents of which are hereby incorporated by reference.

BACKGROUND

The present disclosure relates to an image sensor, and in particular, to a complementary metal-oxide-semiconductor (CMOS) image sensor.

An image sensor is an electronic device that converts optical images into electrical signals. With the recent development of the computer and communications industries, there is an increased demand for high performance image sensors in a variety of applications such as digital cameras, camcorders, personal communication systems, gaming machines, security cameras, micro-cameras for medical applications, and/or robots.

The image sensors may be generally classified into charge-coupled-device (CCD) and/or complementary metal-oxide-semiconductor (CMOS) image sensors. Since the CMOS image sensors have a simple operation method and can be provided in the form of a single chip, in which signal processing circuits are integrated, it is possible to reduce a size of a product therewith. In addition, since CMOS image sensors require a relatively low consumption power, CMOS image sensors may be used in an electronic device with a limited battery capacity. Furthermore, CMOS image sensors may be fabricated using CMOS fabrication techniques, and thus, it may be possible to reduce a manufacturing cost thereof. Moreover, the CMOS image sensor may provide high resolution images. Accordingly, the use of CMOS image sensors is rapidly increasing.

SUMMARY

Some embodiments of the inventive concept provide an image sensor with an improved dark current property.

According to some embodiments of the inventive concept, an image sensor may include a substrate including an active region and a dummy region, a plurality of unit pixels on the active region, a transparent conductive layer on a first surface of the substrate, a light-blocking layer on the transparent conductive layer and electrically connected to the transparent conductive layer, the light-blocking layer having a grid structure adjacent light transmission regions, and a pad electrically connected to the light-blocking layer, on the dummy region.

According to some embodiments of the inventive concept, an image sensor may include a substrate including a first surface and a second surface opposite to the first surface, a first device isolation pattern on the first surface, the first device isolation pattern in a trench adjacent a plurality of unit pixels in the substrate, and a transparent conductive layer on the first device isolation pattern. A depth of the trench may be less than a thickness of the substrate.

According to some embodiments of the inventive concept, an image sensor may include a substrate including a first surface and a second surface opposite to the first surface, a trench defining a plurality of unit pixels in the substrate, and a transparent conductive layer on the first surface of the substrate. The transparent conductive layer may include a vertical portion in the trench, and a width of the vertical portion adjacent to the first surface may be greater than a width of the vertical portion adjacent to the second surface.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below. As used herein, the term "and/or" includes any and all combinations of one or more of the associated listed items. Expressions such as "at least one of," when preceding a list of elements, modify the entire list of elements and do not modify the individual elements of the list. Example embodiments of the inventive concepts will now be described more fully with reference to the accompanying drawings, in which example embodiments are shown.

Figure 1:
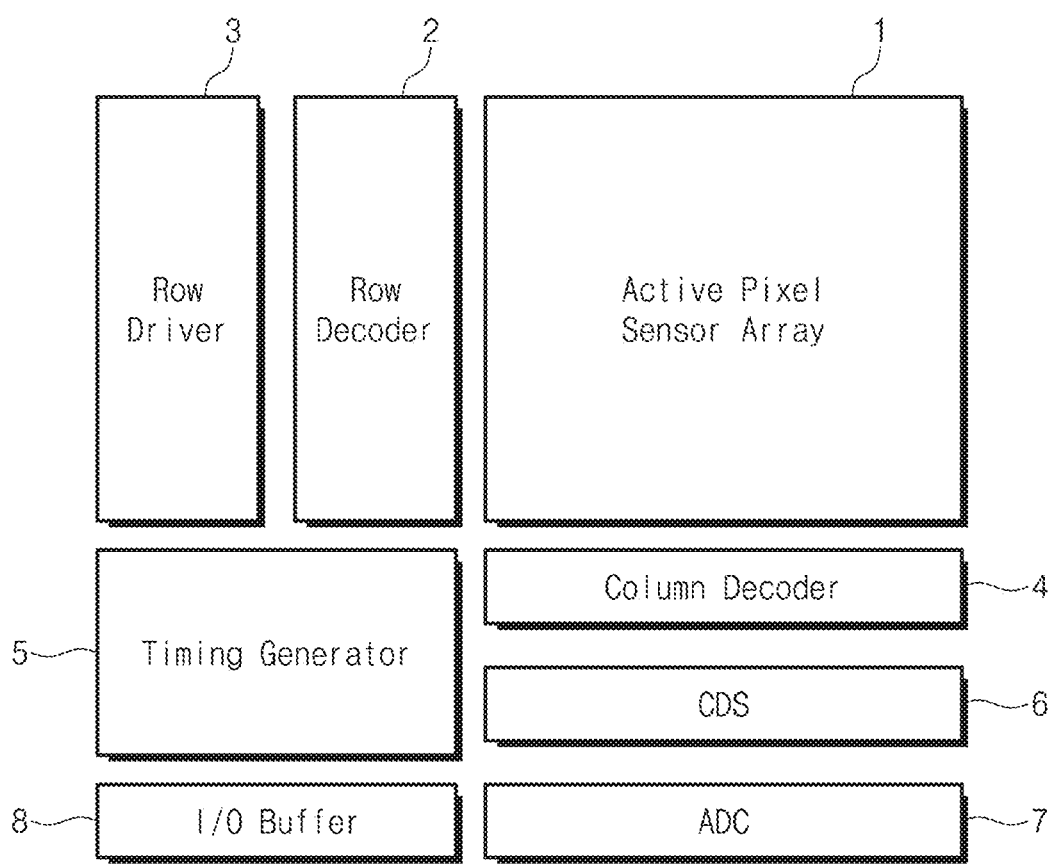
FIG. 1 is a block diagram illustrating an image sensor according to example embodiments of the inventive concept.

FIG. 1 is a block diagram illustrating an image sensor according to example embodiments of the inventive concept.

Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an I/O buffer 8.

The active pixel sensor array 1 may include a plurality of unit pixels, which are two-dimensionally arranged, and may be used to convert optical signals to electrical signals. The active pixel sensor array 1 may be driven by a plurality of driving signals (e.g., pixel-selection, reset, and charge-transfer signals), which are transmitted from the row driver 3. The converted electrical signals may be transmitted to the correlated double sampler 6.

The row driver 3 may be configured to generate driving signals for driving the unit pixels, based on information decoded by the row decoder 2, and then to transmit such driving signals to the active pixel sensor array 1. When the unit pixels are arranged in a matrix form (i.e., in rows and columns), the driving signals may be provided to respective rows.

The timing generator 5 may be configured to provide timing and control signals to the row decoder 2 and column decoder 4.

The correlated double sampler 6 may be configured to receive the electric signals generated in the active pixel sensor array 1 and then to perform operations of holding and sampling the received electric signals. For example, the correlated double sampler 6 may perform a double sampling operation using a specific noise level and a signal level of the electric signal and then output a difference level corresponding to a difference between the noise and signal levels.

The analog-to-digital converter 7 may be configured to convert an analog signal, which includes information on the difference level outputted from the correlated double sampler 6, to a digital signal.

The I/O buffer 8 may be configured to latch the digital signals and then to output the latched digital signals sequentially to an image signal processing part (not shown), based on information decoded by the column decoder 4.

Figure 2:
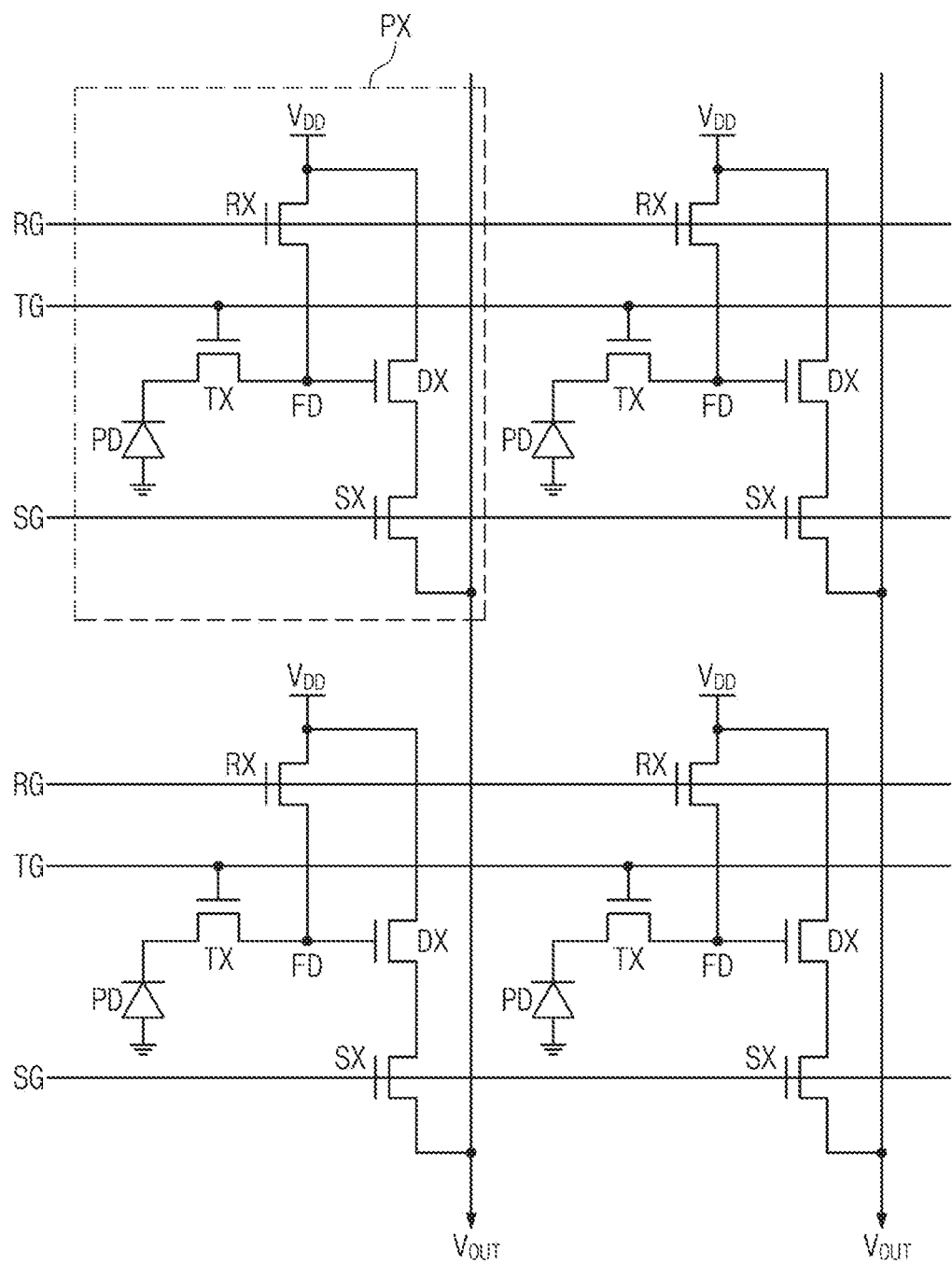
FIG. 2 is a circuit diagram of an active pixel sensor array of an image sensor according to example embodiments of the inventive concept.

FIG. 2 is a circuit diagram of an active pixel sensor array of an image sensor according to example embodiments of the inventive concept.

Referring to FIGS. 1 and 2, the active pixel sensor array 1 may include a plurality of unit pixels PX, which are arranged in a matrix shape. Each of the unit pixels PX may include a transfer transistor TX and logic transistors RX, SX, and DX. The logic transistors may include a reset transistor RX, a selection transistor SX, and a drive transistor DX. The transfer transistor TX may include a transfer gate TG. Each of the unit pixels PX may further include a photoelectric conversion device PD and a floating diffusion region FD.

The photoelectric conversion device PD may be configured to generate photocharges that are proportional to an amount of externally incident light and to store the photocharges. The photoelectric conversion device PD may include a photo diode, a photo transistor, a photo gate, a pinned photo diode, or any combination thereof. The transfer transistor TX may be configured to transfer electric charges, which are generated in the photoelectric conversion device PD, to the floating diffusion region FD. The floating diffusion region FD may be configured to receive the charges, which are generated in the photoelectric conversion device PD, and to cumulatively store them therein. The drive transistor DX may be controlled by an amount of the photocharges to be stored in the floating diffusion region FD.

The reset transistor RX may be configured to periodically discharge the photocharges stored in the floating diffusion region FD. The reset transistor RX may include a drain electrode connected to the floating diffusion region FD and a source electrode connected to a power voltage VDD. When the reset transistor RX is turned on, the power voltage VDD may be applied to the floating diffusion region FD through the source electrode of the reset transistor RX. Accordingly, the electric charges stored in the floating diffusion region FD may be discharged through the reset transistor RX in the turned-on state, and as a result, the floating diffusion region FD may be in a reset state.

The drive transistor DX may serve as a source follower buffer amplifier. The drive transistor DX may be configured to amplify a variation in electric potential of the floating diffusion region FD and to output the amplified signal to an output line Vout.

The selection transistor SX may be used to select each row of the unit pixels PX for a read operation. When the selection transistor SX is turned on, the power voltage VDD may be applied to a drain electrode of the drive transistor DX.

Figure 3:
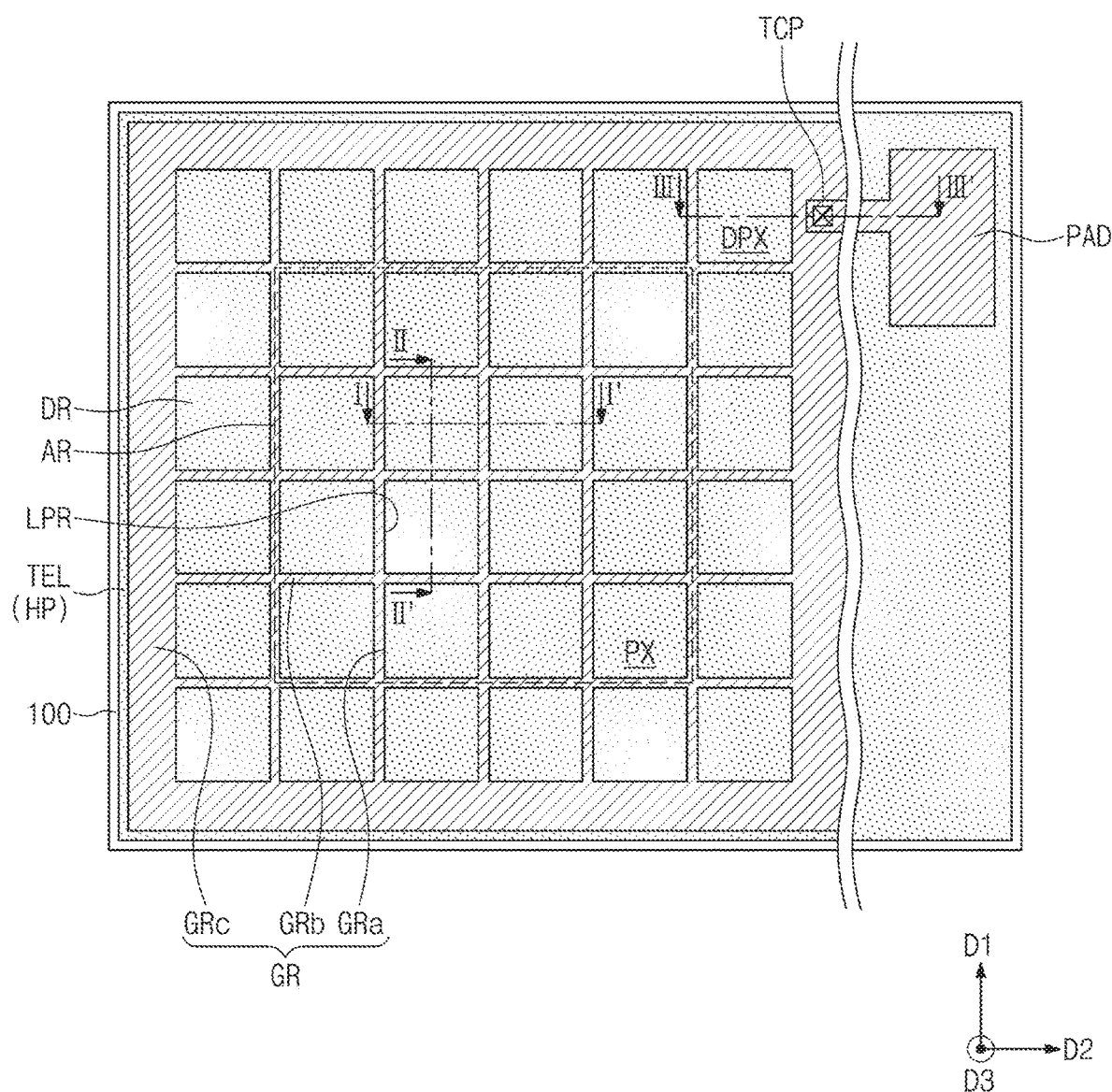
FIG. 3 is a plan view illustrating an image sensor according to example embodiments of the inventive concept.
Figure 4A:
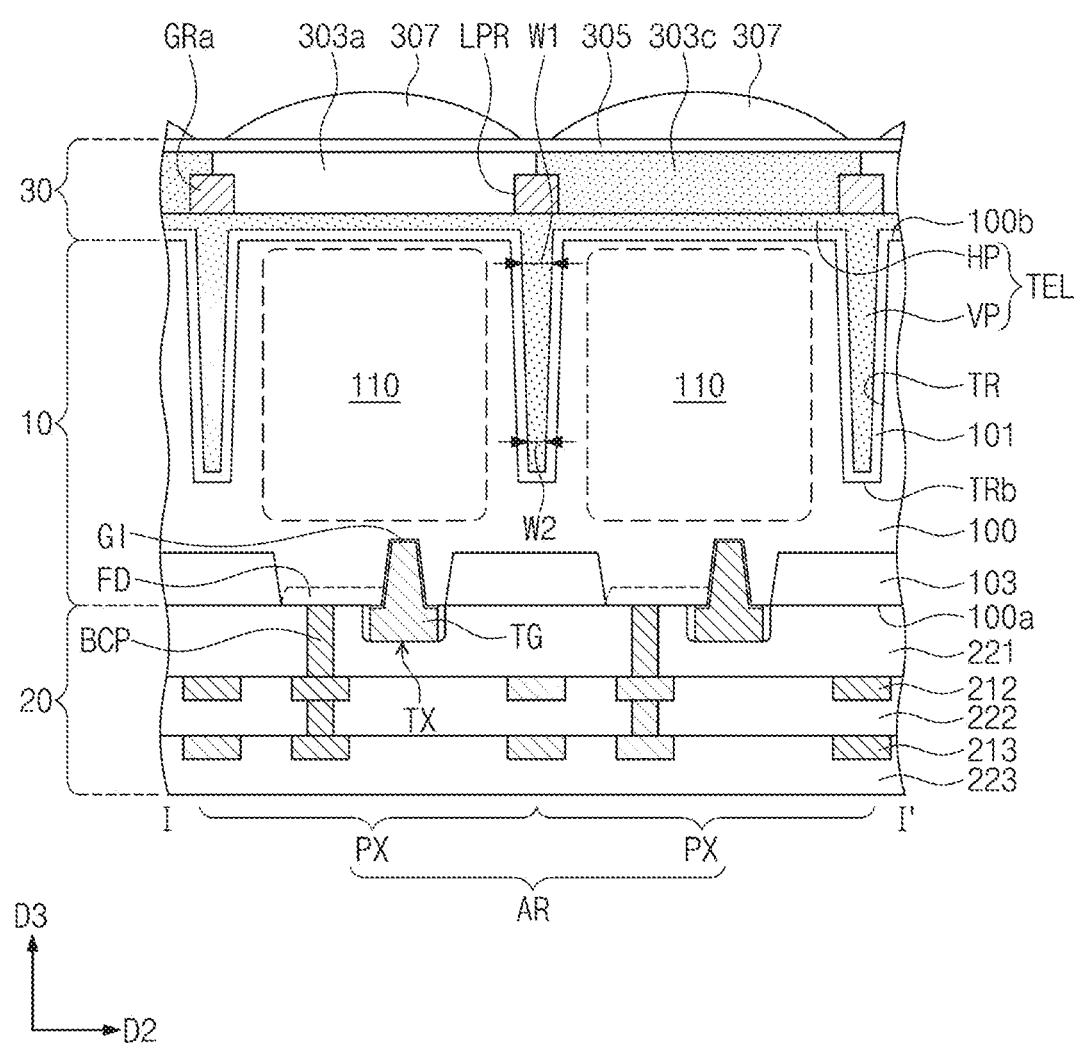
FIGS. 4A, 4B, and 4C are sectional views taken along lines I-I', II-II', and III-III', respectively, of FIG. 3.
Figure 4B:
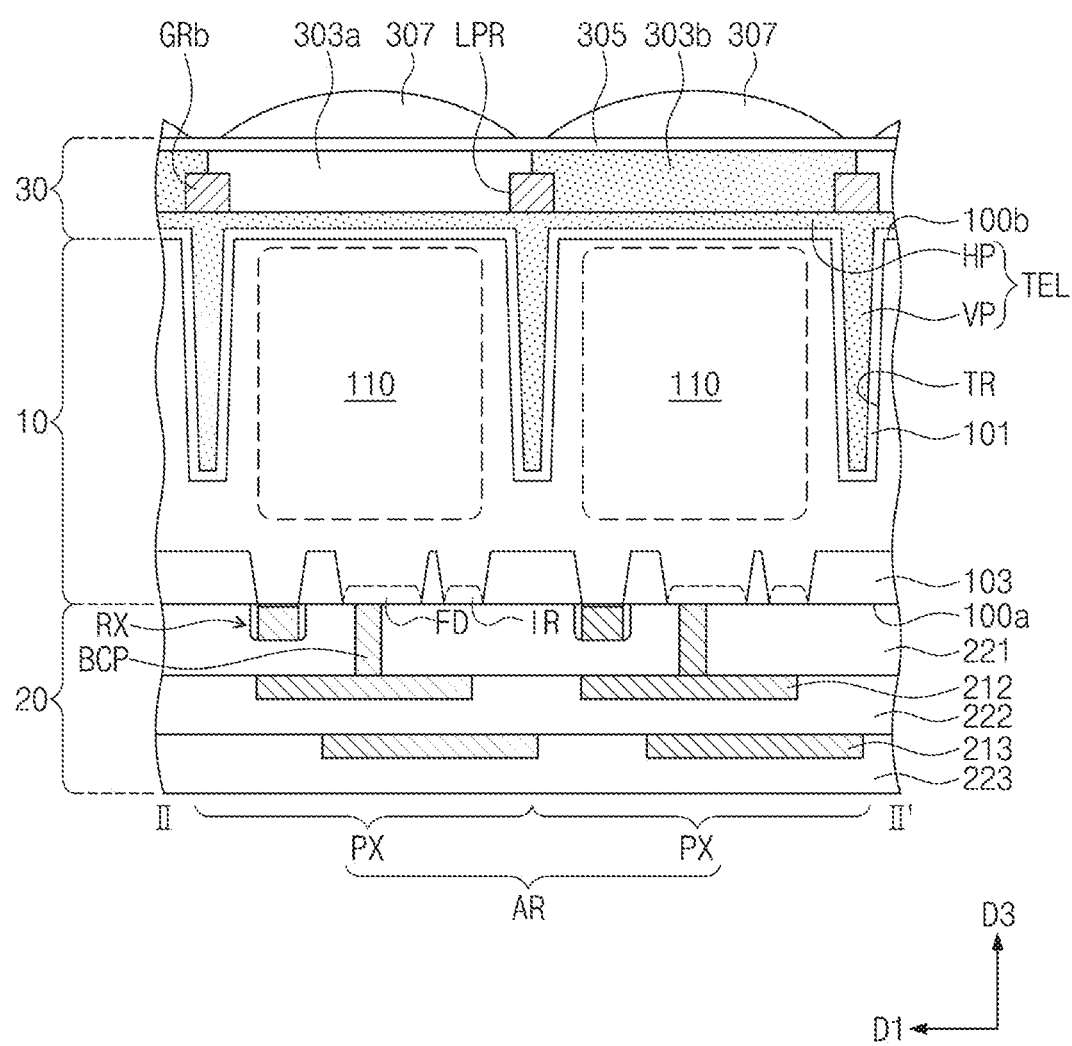
Figure 4C:
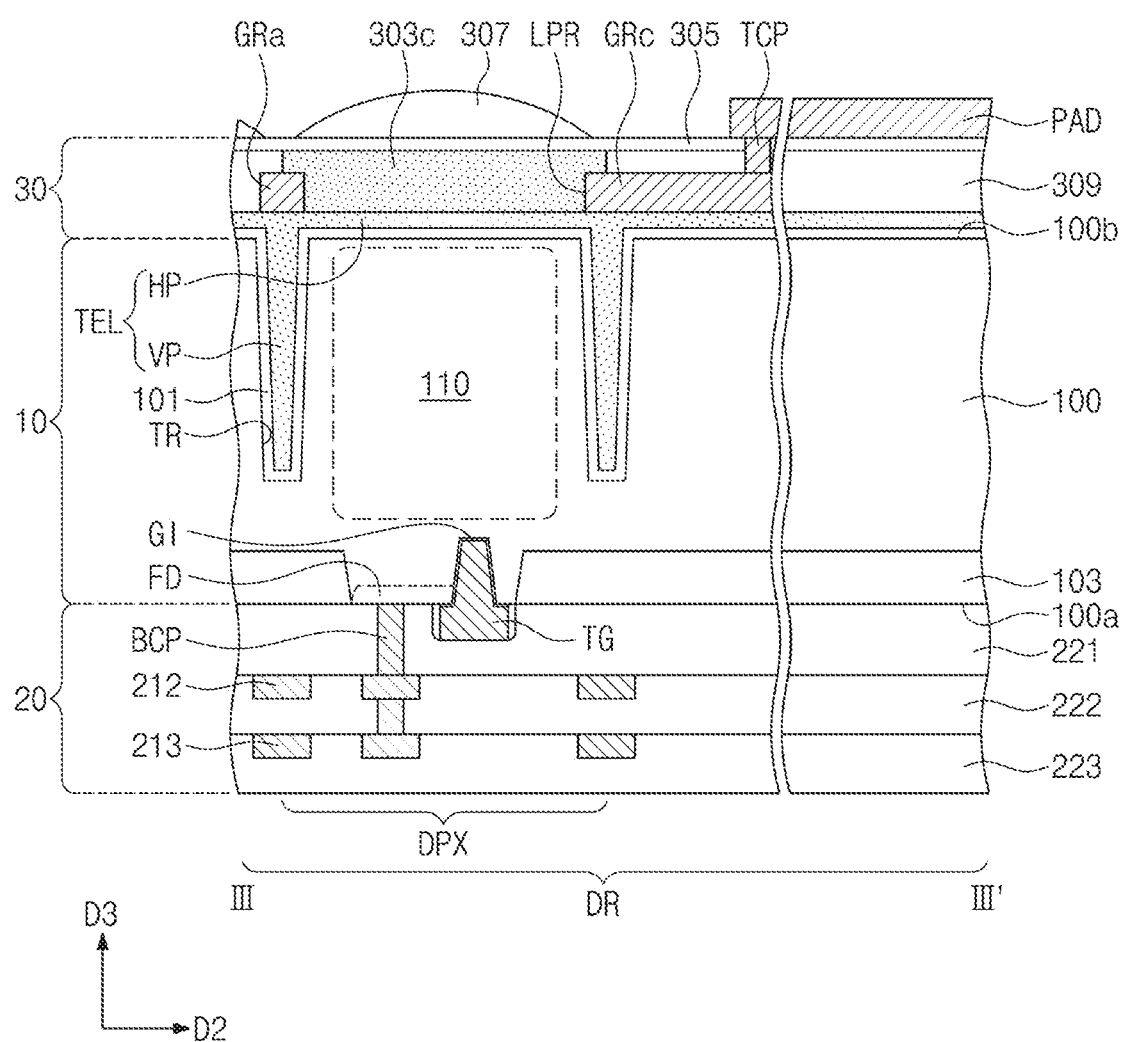

FIG. 3 is a plan view illustrating an image sensor according to example embodiments of the inventive concept. FIGS. 4A, 4B, and 4C are sectional views taken along lines I-I', and III-III', respectively, of FIG. 3.

Referring to FIGS. 3 and 4A to 4C, an image sensor, according to example embodiments of the inventive concept, may include a photoelectric conversion layer 10, an interconnection layer 20, and an optically-transparent layer 30. The photoelectric conversion layer 10 may be interposed between the interconnection layer 20 and the optically-transparent layer 30. The photoelectric conversion layer 10 may include a semiconductor substrate 100 and photoelectric conversion regions 110, which are provided in the semiconductor substrate 100. The photoelectric conversion regions 110 may be configured to convert light, which is incident from the outside, to electrical signals.

The semiconductor substrate 100 may have a first or front surface 100a and a second or rear surface 100b, which are opposite to each other. The interconnection layer 20 may be disposed on the first surface 100a of the semiconductor substrate 100, and the optically-transparent layer 30 may be disposed on the second surface 100b of the semiconductor substrate 100. It will be understood that, although the terms first, second, third, etc. may be used herein to describe various elements, and elements should not be limited by these terms; rather, these terms are only used to distinguish one element from another element. Thus, a first element discussed below could be termed a second element without departing from the scope of the present inventive concepts.

The semiconductor substrate 100 may be a substrate, in which an epitaxial layer of a first conductivity type (e.g., p-type) is formed on a bulk silicon wafer of the first conductivity type. During a process of fabricating an image sensor, the bulk silicon wafer may be removed, and in this case, the semiconductor substrate 100 may be formed of the epitaxial layer of the first conductivity type. As another example, the semiconductor substrate 100 may be a bulk silicon wafer, in which a well of the first conductivity type is formed. As still another example, the semiconductor substrate 100 may include an epitaxial layer of a second conductivity type (e.g., n-type), a bulk silicon wafer of the second conductivity type, or a silicon-on-insulator (SOI) wafer.

The semiconductor substrate 100 may include an active region AR, which is provided in a center region thereof, and a dummy region DR, which is provided to enclose the active region AR. A plurality of the unit pixels PX may be provided on the active region AR. A plurality of dummy pixels DPX may be provided on at least a portion of the dummy region DR. The dummy pixel DPX may have a similar structure to the unit pixel PX but may not be used for an image sensing operation of the unit pixel PX (i.e., of converting optical signals to electrical signals).

The active region AR may include a plurality of the unit pixels PX. A first device isolation pattern 101 may be provided adjacent to the second surface 100b of the semiconductor substrate 100 to define a plurality of the unit pixels PX. The first device isolation pattern 101 may partially fill a trench TR, which extends from the second surface 100b of the semiconductor substrate 100 toward the first surface 100a. The first device isolation pattern 101 may at least partially cover the second surface 100b of the semiconductor substrate 100. In other words, the first device isolation pattern 101 may include a first portion in the trench TR and a second portion covering the second surface 100b of the semiconductor substrate 100. The first device isolation pattern 101 may include an insulating material whose refractive index is lower than that of the semiconductor substrate 100 (e.g., made of silicon). For example, the first device isolation pattern 101 may include at least one of a silicon oxide layer, a silicon oxynitride layer, or a silicon nitride layer.

A bottom TRb of the trench TR may be spaced apart from the first surface 100a of the semiconductor substrate 100. In other words, a depth of the trench TR may be smaller than a thickness of the semiconductor substrate 100. A width of the trench TR may gradually decrease in a direction from the second surface 100b of the semiconductor substrate 100 toward the first surface 100a.

The unit pixels PX may be two-dimensionally arranged in a first direction D1 and a second direction D2, which are not parallel to each other. In other words, the unit pixels PX may be arranged in the first and second directions D1 and D2 or in a matrix shape.

The photoelectric conversion region 110 may be provided in each of the unit pixels PX. The photoelectric conversion region 110 may be an impurity region having a second conductivity type (e.g., n-type) that is different from the first conductivity type of the semiconductor substrate 100. As an example, the photoelectric conversion region 110 may be adjacent to the second surface 100b of the semiconductor substrate 100 and may be vertically spaced apart from the first surface 100a. The photoelectric conversion region 110 may have a difference in impurity concentration between a first region adjacent to the first surface 100a and a second region adjacent to the second surface 100b.

The semiconductor substrate 100 and the photoelectric conversion region 110 may constitute a photodiode. In each of the unit pixels PX, the semiconductor substrate 100 of the first conductivity type and the photoelectric conversion region 110 of the second conductivity type may constitute a p-n junction photodiode. The photoelectric conversion region 110 constituting the photodiode may be configured to generate and accumulate photocharges, and an amount of the photocharges may be in proportion to an intensity of an incident light.

A second device isolation pattern 103 may be provided adjacent to the first surface 100a of the semiconductor substrate 100 to define a plurality of active patterns. Each of the unit pixels PX may include the active patterns. Each of the active patterns may include, for example, the floating diffusion region FD and an impurity region IR.

A width of the second device isolation pattern 103 may gradually decrease in a direction from the first surface 100a of the semiconductor substrate 100 toward the second surface 100b. The second device isolation pattern 103 may be vertically spaced apart from the first device isolation pattern 101. The second device isolation pattern 103 may be formed of or include at least one of a silicon oxide layer, a silicon oxynitride layer, or a silicon nitride layer.

The transfer transistors TX and the logic transistors RX, SX, and DX previously described with reference to FIG. 2 may be provided on the first surface 100a of the semiconductor substrate 100. The transfer transistor TX may be provided on each of the unit pixels PX. The transfer transistor TX may be electrically connected to the photoelectric conversion region 110.

The transfer transistor TX may include the transfer gate TG and the floating diffusion region FD. The transfer gate TG may include a lower portion, which is inserted in the semiconductor substrate 100, and an upper portion, which is connected to the lower portion and has an upward protruding shape relative to the first surface 100a of the semiconductor substrate 100. A gate dielectric layer GI may be interposed between the transfer gate TG and the semiconductor substrate 100. The floating diffusion region FD may have a second conductivity type (e.g., n-type) that is different from the first conductivity type of the semiconductor substrate 100.

The logic transistors (e.g., RX, SX, and DX of FIG. 2) may be provided on each of the unit pixels PX. As an example, the logic transistors may include the reset transistor RX.

The interconnection layer 20 may include first to third interlayered insulating layers 221, 222, and 223, which cover the transfer transistors TX and the logic transistors RX, SX, and DX, and first and second interconnection lines 212 and 213. The first and second interconnection lines 212 and 213 may be electrically connected to the transfer transistors TX and the logic transistors RX, SX, and DX through lower contact plugs BCP.

The interconnection layer 20 may be configured to perform a signal processing operation on electrical signals, which are converted by the photoelectric conversion regions 110. The first and second interconnection lines 212 and 213 may be provided in the second and third interlayered insulating layers 222 and 223, respectively, which are stacked on the first surface 100a of the semiconductor substrate 100. In some embodiments, the first and second interconnection lines 212 and 213 may be provided, regardless of the arrangement of the photoelectric conversion regions 110. When viewed in a plan view, the first and second interconnection lines 212 and 213 may be provided to cross the photoelectric conversion regions 110.

The optically-transparent layer 30 may include a transparent conductive layer TEL, a light-blocking layer GR, first to third color filters 303a, 303b, and 303c, and micro lenses 307. The optically-transparent layer 30 may be configured to collect and filter externally incident light and then to provide the light to the photoelectric conversion layer 10.

The transparent conductive layer TEL may be provided on the first device isolation pattern 101. The transparent conductive layer TEL may be electrically disconnected from the semiconductor substrate 100 by the first device isolation pattern 101. The light-blocking layer GR may be provided on the transparent conductive layer TEL. As an example, the transparent conductive layer TEL may be formed of or include at least one of indium tin oxide (ITO), indium zinc oxide (IZO), zinc oxide (ZnO), or organic transparent conductive materials. As an example, the light-blocking layer GR may be formed of or include at least one of metallic materials, such as tungsten (W), copper (Cu), hafnium (Hf), zirconium (Zr), titanium (Ti), tantalum (Ta), aluminum (Al), ruthenium (Ru), palladium (Pd), platinum (Pt), cobalt (Co), or nickel (Ni).

The light-blocking layer GR may have a grid structure. In detail, the light-blocking layer GR may include first extended portions GRa extending in the first direction D1 and second extended portions GRb extending in the second direction D2. Light transmission regions LPR may be defined by the first extended portions GRa and the second extended portions GRb crossing each other. The light transmission regions LPR may be two-dimensionally arranged in the first and second directions D1 and D2. The light transmission regions LPR may be vertically overlapped with the unit pixels PX and the dummy pixels DPX. Light may be incident into the unit pixels PX through the light transmission regions LPR.

The light-blocking layer GR may further include a light-blocking portion GRc on the dummy region DR. The light-blocking portion GRc may be adjacent to the dummy pixels DPX. The light-blocking portion GRc may prevent light from being incident into the semiconductor substrate 100.

The light-blocking layer GR may be electrically connected to a pad PAD on a peripheral region of the semiconductor substrate 100 (e.g., outside the dummy region DR). As an example, the light-blocking layer GR and the pad PAD may be electrically connected to each other through a conductive line extended from the pad PAD and an upper contact plug TCP between the conductive line and the light-blocking layer GR.

A negative voltage may be applied to the pad PAD. As an example, the pad PAD may be connected to a charge pump and may be applied with a negative voltage that is provided from the charge pump. In some embodiments, a constant negative voltage may be applied to the pad PAD.

The transparent conductive layer TEL may include a horizontal portion HP and a vertical portion VP. The horizontal portion HP may be provided to fully cover the second surface 100b of the semiconductor substrate 100, in some embodiments. The horizontal portion HP may be substantially parallel to the second surface 100b of the semiconductor substrate 100. The horizontal portion HP may be interposed between the light-blocking layer GR and the first device isolation pattern 101. The horizontal portion HP may be interposed between the first to third color filters 303a, 303b, and 303c and the first device isolation pattern 101. The horizontal portion HP may be vertically overlapped with the unit pixels PX and the dummy pixels DPX.

The vertical portion VP may be vertically extended from the second surface 100b of the semiconductor substrate 100 toward the first surface 100a. When viewed in a plan view, the vertical portion VP may be overlapped with the first extended portions GRa and the second extended portions GRb of the light-blocking layer GR. In other words, the vertical portion VP may have a grid structure. The vertical portion VP may at least partially fill the trench TR provided with the first device isolation pattern 101. The vertical portion VP may be interposed between each adjacent pair of the unit pixels PX. When viewed in a plan view, the vertical portion VP may be provided to surround each of the unit pixels PX. A width of the vertical portion VP may gradually decrease in a direction from the second surface 100b of the semiconductor substrate 100 toward the first surface 100a. As an example, a width W1 of the vertical portion VP adjacent to the second surface 100b may be larger than a width W2 of the vertical portion VP adjacent to the first surface 100a.

The light-blocking layer GR and the transparent conductive layer TEL may be in direct contact with each other and may be electrically connected to each other. The negative voltage may be applied to the transparent conductive layer TEL through the pad PAD and the light-blocking layer GR. Positive charges, which are produced in the unit pixels PX, may be discharged through the transparent conductive layer TEL surrounding the unit pixels PX. Thus, it may be possible to improve a dark current property of an image sensor.

The first to third color filters 303a, 303b, and 303c may be provided on the transparent conductive layer TEL and the light-blocking layer GR. The first to third color filters 303a, 303b, and 303c may be provided on the unit pixels PX, respectively. The micro lenses 307 may be provided on the first to third color filters 303a, 303b, and 303c, respectively. A planarization layer 305 may be interposed between the first to third color filters 303a, 303b, and 303c and the micro lenses 307.

The first to third color filters 303a, 303b, and 303c may be primary color filters. As an example, the first color filter 303a may be a green color filter, the second color filter 303b may be a blue color filter, and the third color filter 303c may be a red color filter. In some embodiments, the first to third color filters 303a, 303b, and 303c may be arranged in a Bayer pattern.

Figure 5:
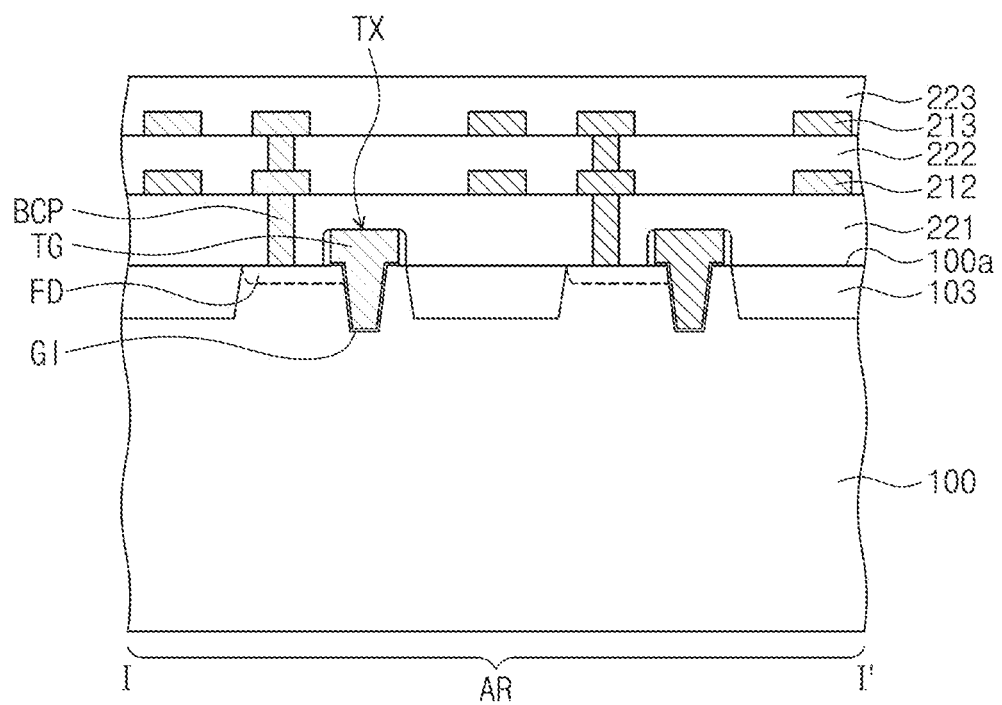
FIGS. 5 to 7 are sectional views, which are taken along line I-I' of FIG. 3 and illustrate a method of fabricating an image sensor according to example embodiments of the inventive concept.
Figure 6:
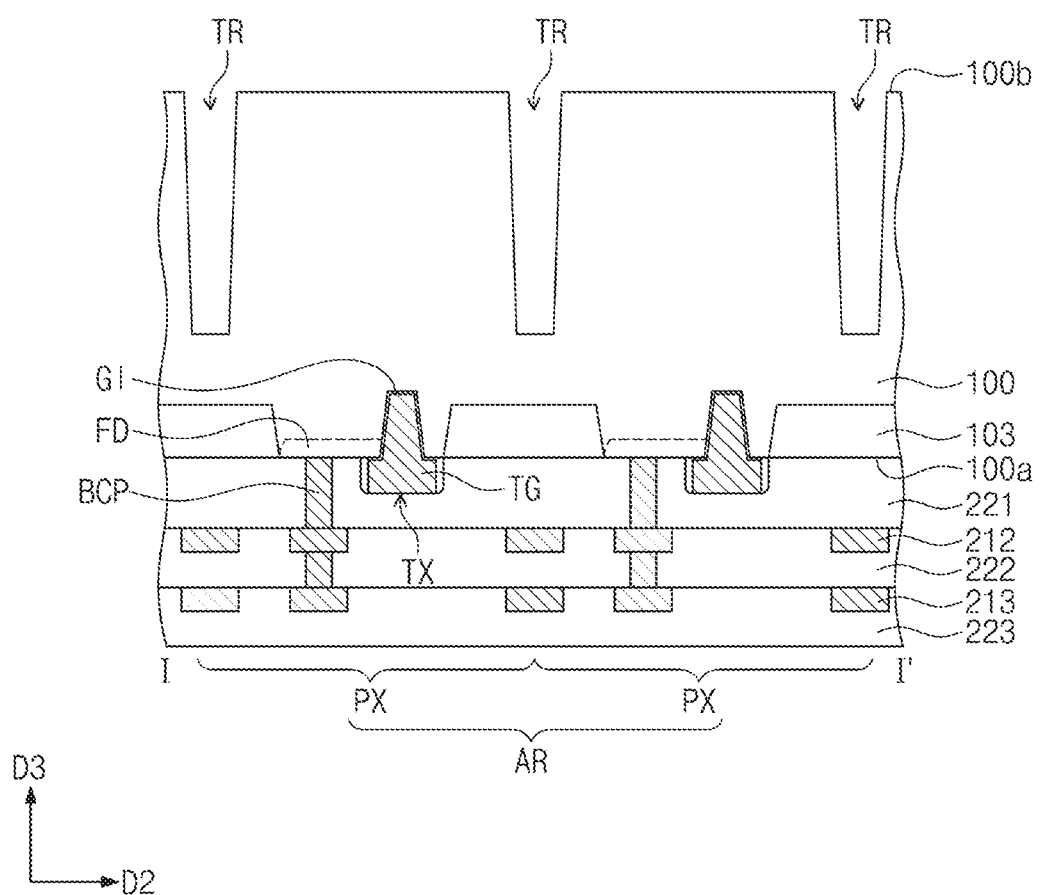
Figure 7:
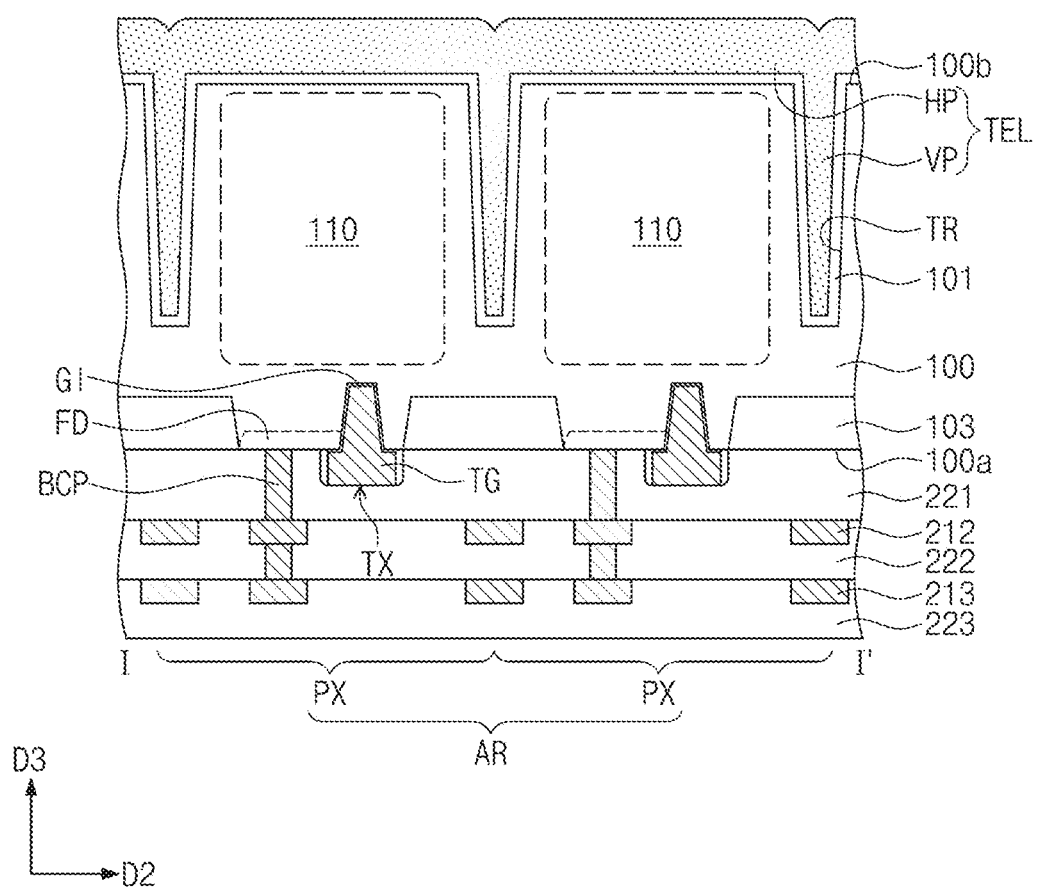

FIGS. 5 to 7 are sectional views, which are taken along line I-I' of FIG. 3 and illustrate a method of fabricating an image sensor according to example embodiments of the inventive concept.

Referring to FIGS. 3 and 5, the semiconductor substrate 100 having the first and second surfaces 100a and 100b opposite to each other may be provided. The semiconductor substrate 100 may include the active region AR and the dummy region DR. The semiconductor substrate 100 may be doped to have a first conductivity type (e.g., p-type).

The second device isolation pattern 103 may be formed on the first surface 100a of the semiconductor substrate 100. The formation of the second device isolation pattern 103 may include forming shallow trenches in the first surface 100a of the semiconductor substrate 100 and at least partially filling the shallow trenches with an insulating layer. The insulating layer may be formed of or include at least one of silicon oxide, silicon nitride, or silicon oxynitride.

The second device isolation pattern 103 may be formed to define active patterns. The floating diffusion region FD and the impurity region IR may be formed by doping each of the active patterns with impurities. The transfer transistors TX and the logic transistors RX, SX, and DX previously described with reference to FIG. 2 may be formed on the active patterns.

The first interlayered insulating layer 221 may be formed on the first surface 100a of the semiconductor substrate 100. The first interlayered insulating layer 221 may be formed to cover the transfer transistors TX and the logic transistors RX, SX, and DX, which are formed on the first surface 100a of the semiconductor substrate 100.

The second and third interlayered insulating layers 222 and 223 may be formed on the first interlayered insulating layer 221. The first and second interconnection lines 212 and 213 may be formed in the second and third interlayered insulating layers 222 and 223, respectively. The lower contact plugs BCP may be formed to electrically connect the first and second interconnection lines 212 and 213 to the transfer transistors TX and the logic transistors RX, SX, and DX.

Referring to FIGS. 3 and 6, an etching process may be performed on the second surface 100b of the semiconductor substrate 100 to form the trench TR. The trench TR may be formed to have a depth that is less than a thickness of the semiconductor substrate 100. The trench TR may be formed to have a gradually decreasing width in a direction from the second surface 100b of the semiconductor substrate 100 toward the first surface 100a. When viewed in a plan view, the trench TR may be formed to have a grid structure. A plurality of the unit pixels PX may be defined in the active region AR by the trench TR. The unit pixels PX may be two-dimensionally arranged in two different directions (e.g., the first and second directions D1 and D2).

Referring to FIGS. 3 and 7, the first device isolation pattern 101 and the transparent conductive layer TEL may be sequentially formed to at least partially fill the trench TR. The first device isolation pattern 101 may be conformally formed to partially fill the trench TR. The first device isolation pattern 101 may cover the second surface 100b of the semiconductor substrate 100. In some embodiments, the first device isolation pattern 101 may include at least one of a silicon oxide layer, a silicon oxynitride layer, or a silicon nitride layer.

The transparent conductive layer TEL may be formed to completely fill the trench TR provided with the first device isolation pattern 101. The transparent conductive layer TEL may include the horizontal portion HP, which is provided on the second surface 100b of the semiconductor substrate 100, and the vertical portion VP, which is provided to at least partially fill the trench TR. As an example, the transparent conductive layer TEL may be formed of or include at least one of indium tin oxide (ITO), indium zinc oxide (IZO), zinc oxide (ZnO), or organic transparent conductive materials.

The photoelectric conversion regions 110 may be formed in the unit pixels PX by doping the active region AR with impurities. The photoelectric conversion regions 110 may have a second conductivity type (e.g., n-type), which is different from the first conductivity type (e.g., p-type).

Referring back to FIGS. 3 and 4A to 4C, a planarization process may be performed on the second surface 100b of the semiconductor substrate 100 to allow the transparent conductive layer TEL to have a flat top surface. The light-blocking layer GR may be formed on the transparent conductive layer TEL. The light-blocking layer GR may be formed to have a grid structure. The first to third color filters 303a, 303b, and 303c may be formed on the light-blocking layer GR. The first to third color filters 303a, 303b, and 303c may be formed on the unit pixels PX, respectively. The micro lenses 307 may be formed on the first to third color filters 303a, 303b, and 303c.

Figure 8A:
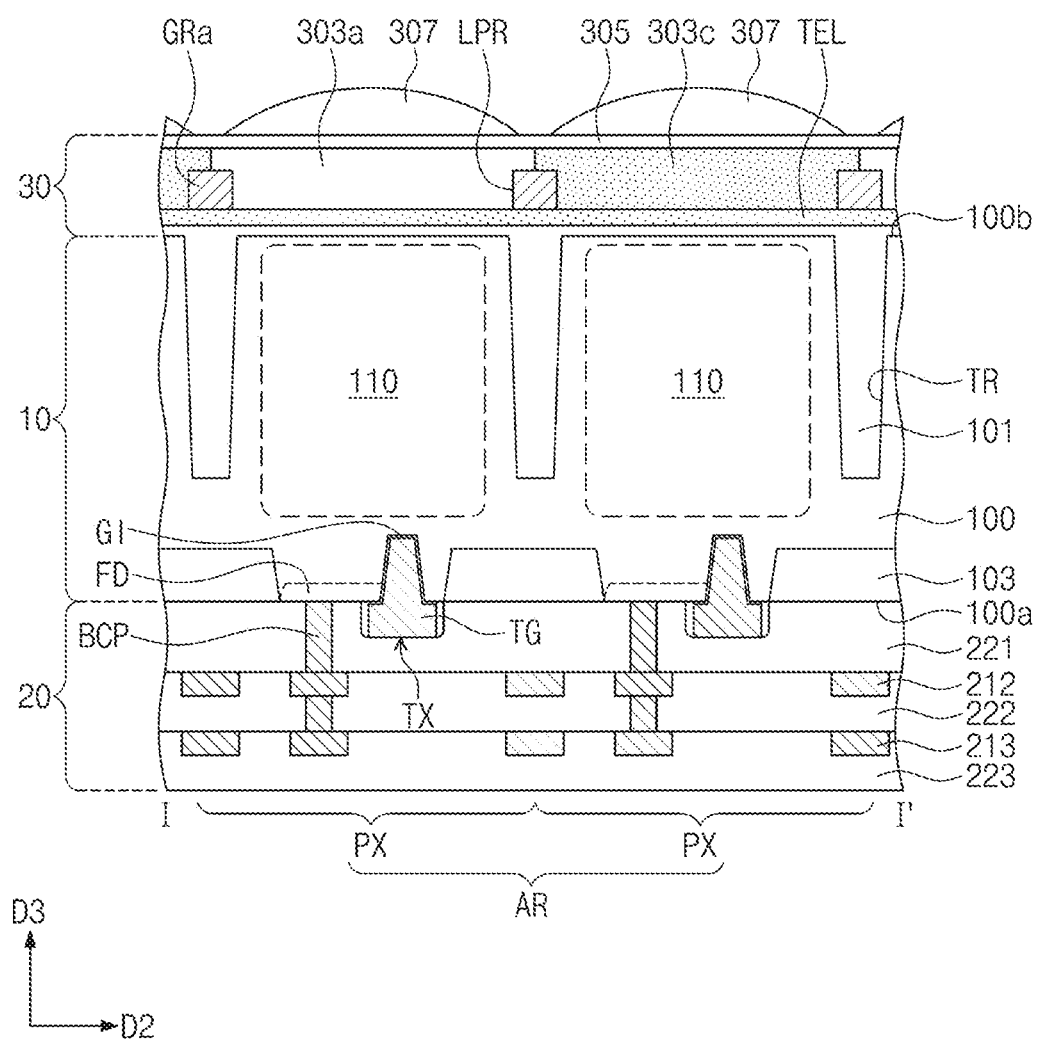
FIGS. 8A, 8B and FIG. 8C are sectional views, which are taken along lines I-I', II-II', and III-III', respectively, of FIG. 3 and illustrate an image sensor according to example embodiments of the inventive concept.
Figure 8B:
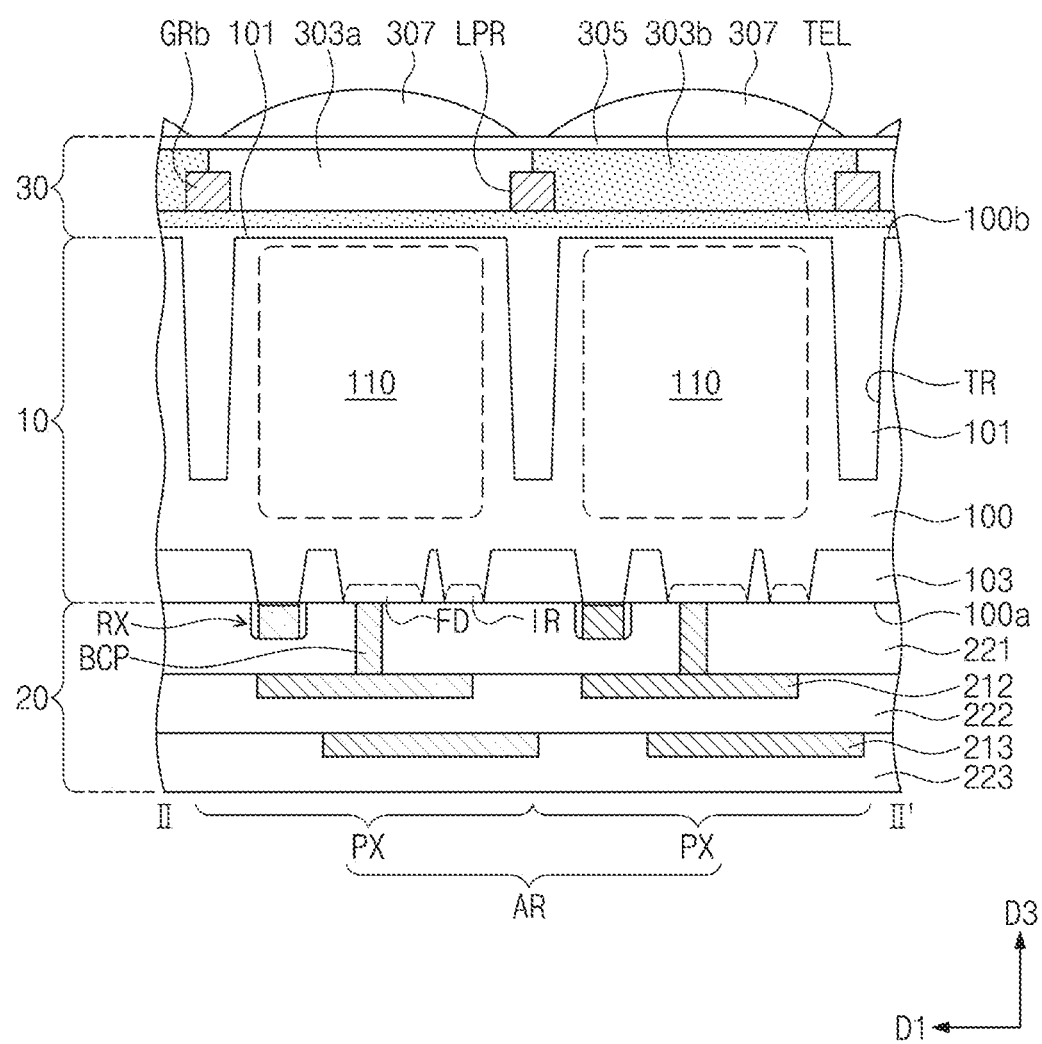
Figure 8C:
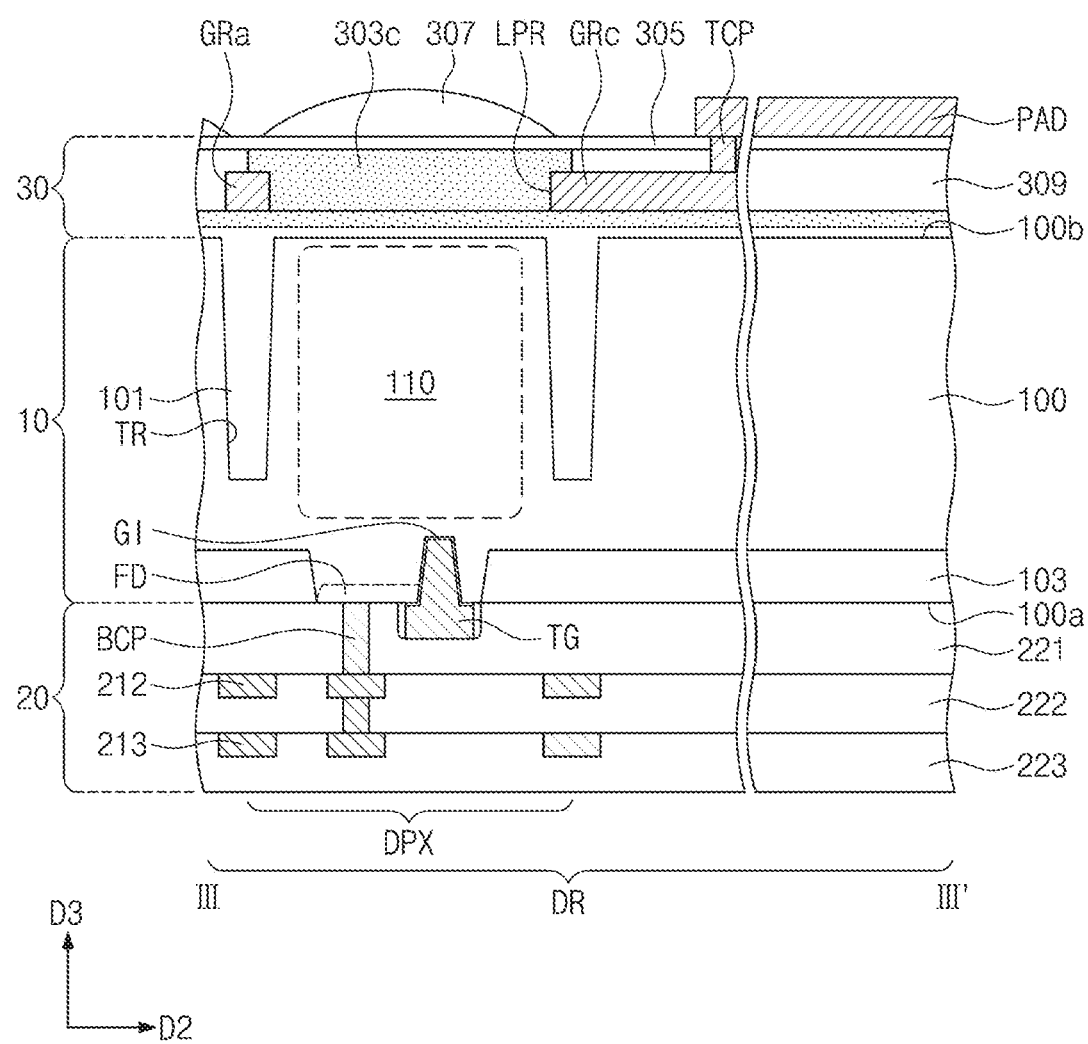

FIGS. 8A, 8B and FIG. 8C are sectional views, which are taken along lines I-I', II-II', and III-III', and respectively, of FIG. 3 and illustrate an image sensor according to example embodiments of the inventive concept. In the following description, an element previously described with reference to FIGS. 3 and 4A to 4C may be identified by the same reference number without repeating an overlapping description thereof.

Referring to FIGS. 3 and 8A to 8C, the first device isolation pattern 101 may be provided to fully fill the trench TR. In other words, the vertical portion VP of the transparent conductive layer TEL described with reference to FIGS. 4A to 4C may be omitted. The transparent conductive layer TEL may cover a top surface of the first device isolation pattern 101. The transparent conductive layer TEL may be parallel to the second surface 100b of the semiconductor substrate 100.

Figure 9:
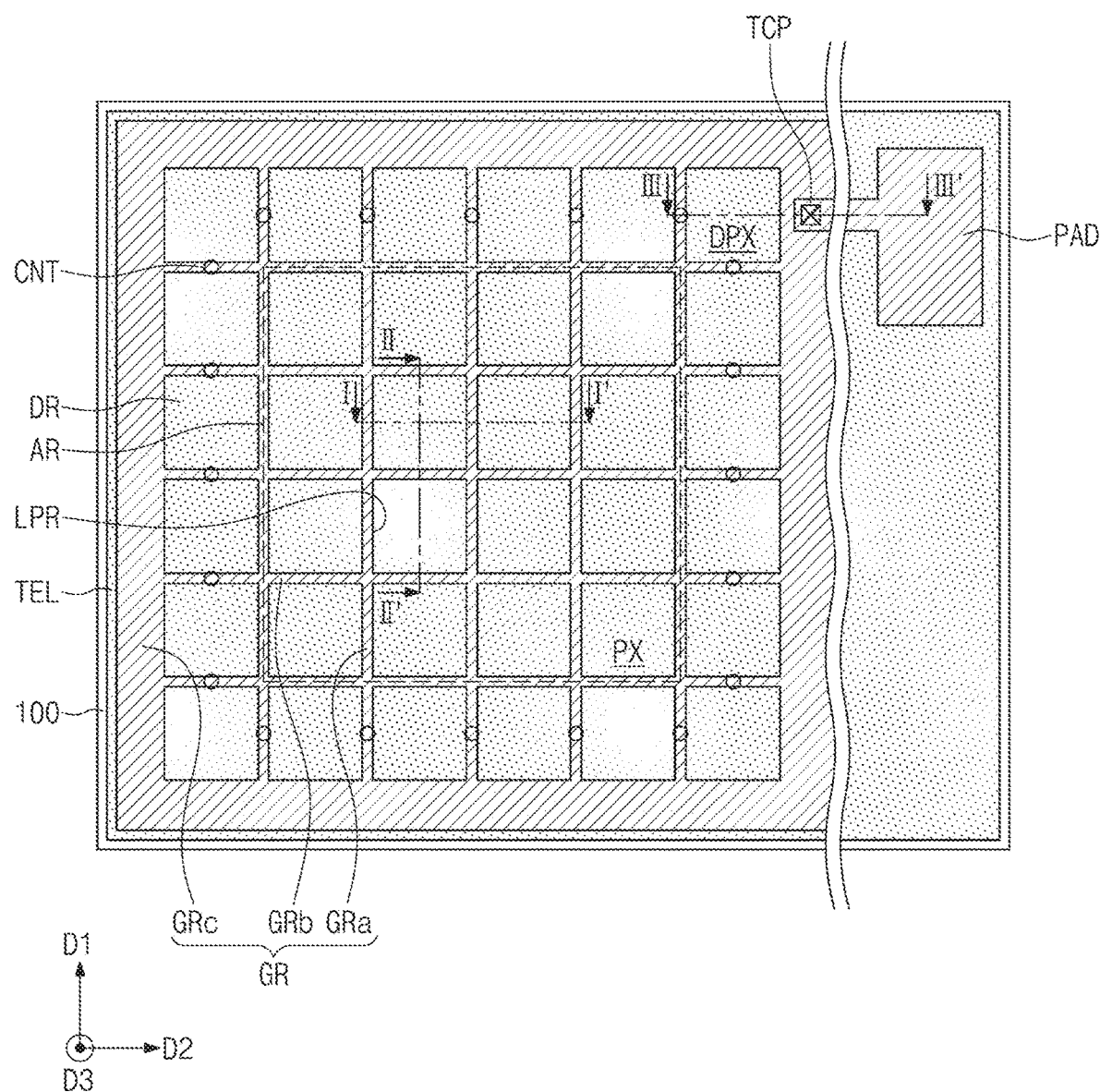
FIG. 9 is a plan view illustrating an image sensor according to example embodiments of the inventive concept.
Figure 10A:
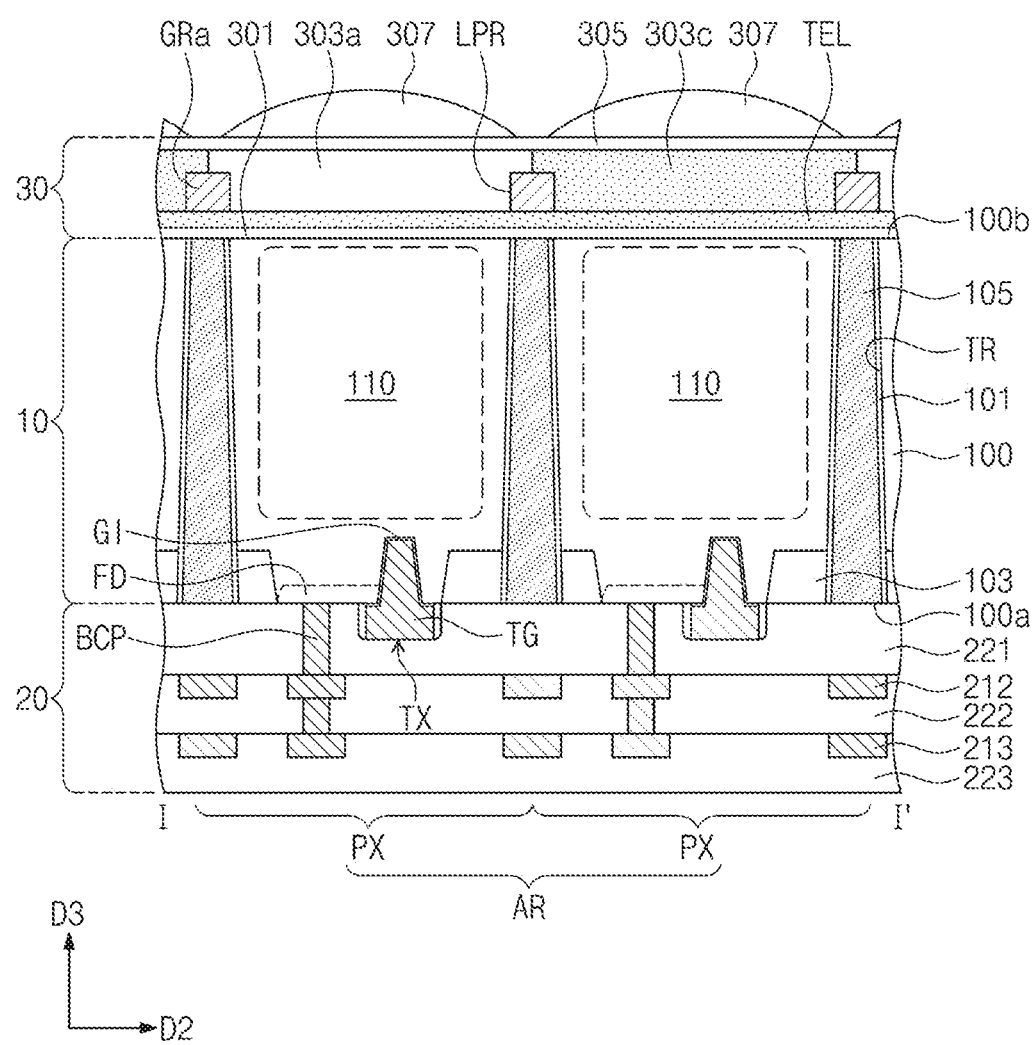
FIGS. 10A, 10B, and 10C are sectional views taken along lines I-I', II-II', and III-III', and respectively, of FIG. 9.
Figure 10B:
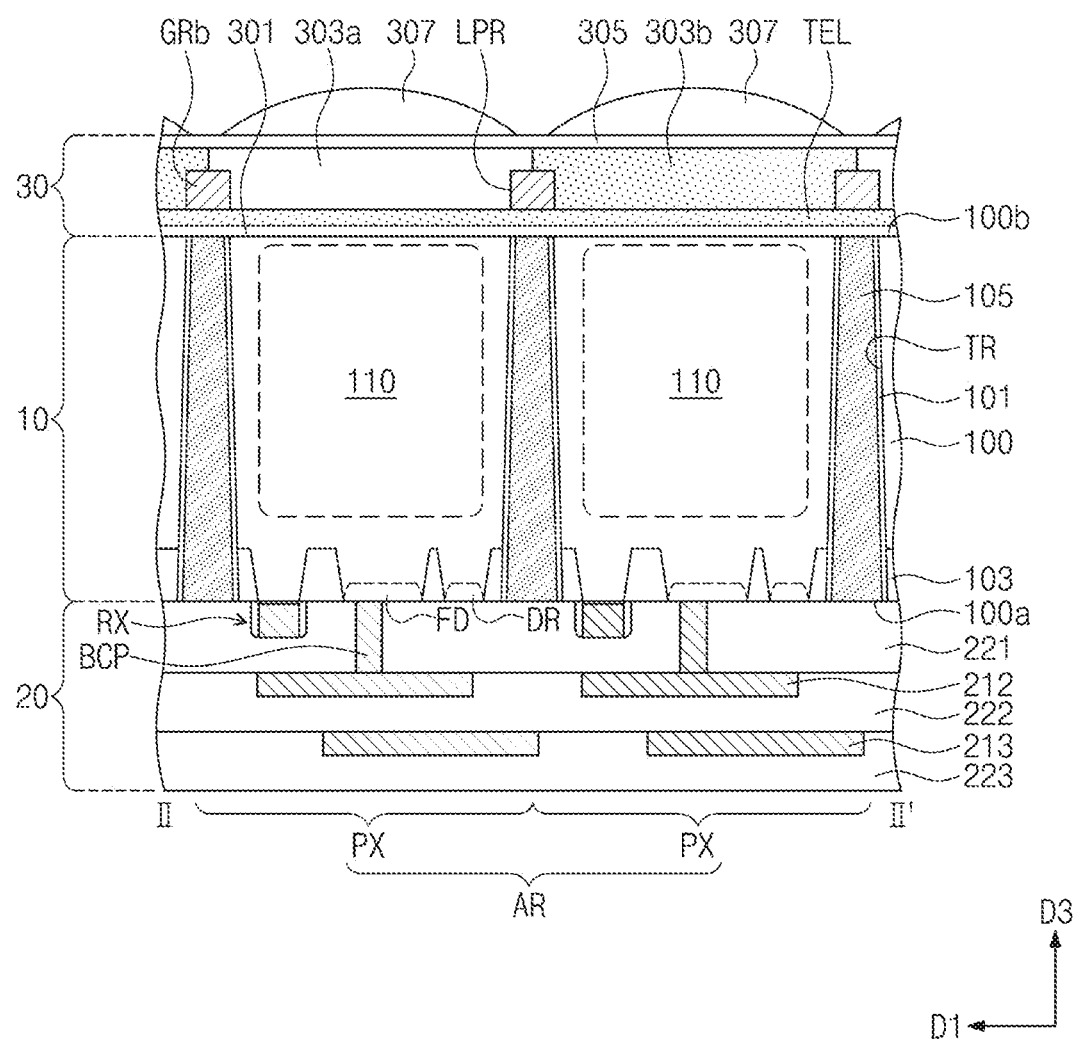
Figure 10C:
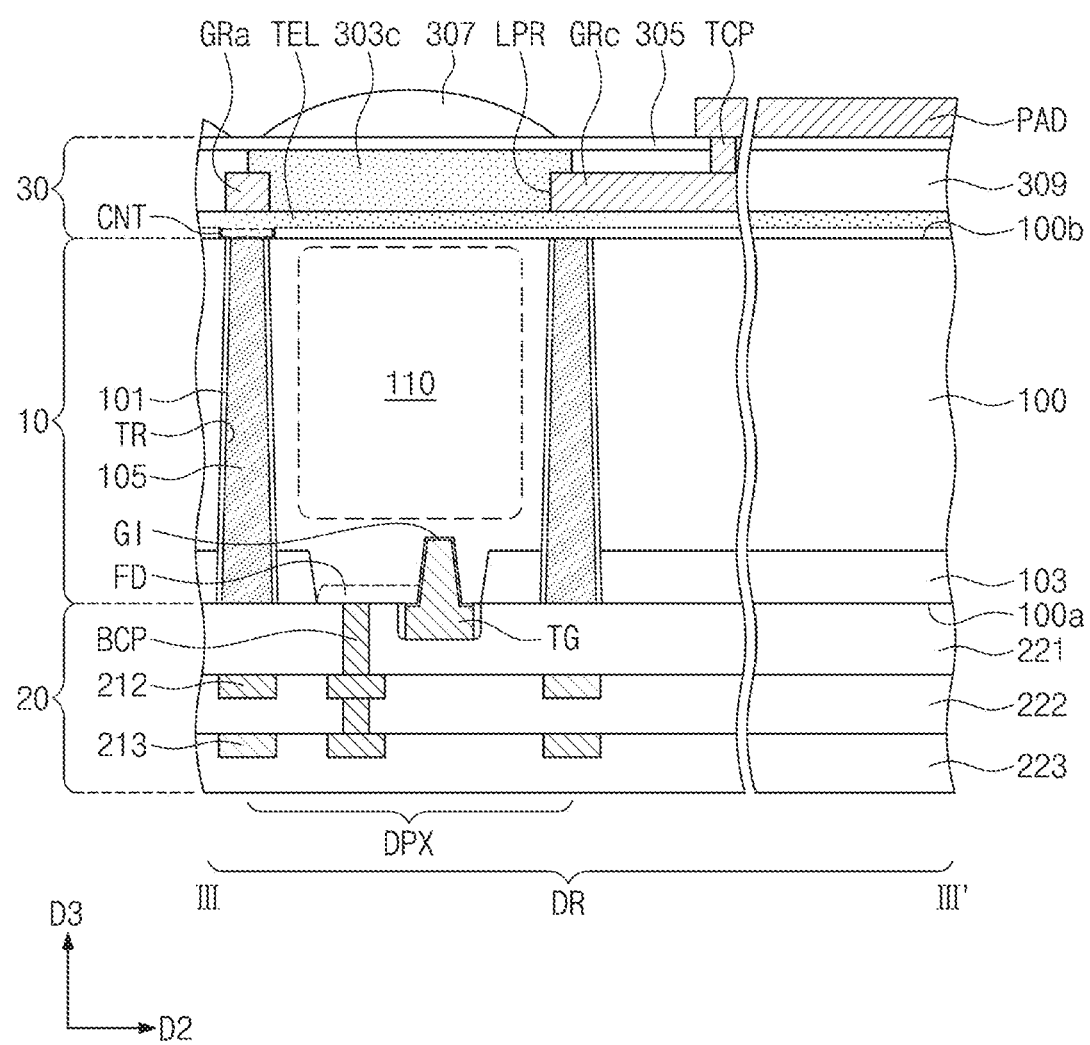

FIG. 9 is a plan view illustrating an image sensor according to example embodiments of the inventive concept. FIGS. 10A, 10B, and 10C are sectional views taken along lines I-I', II-II', and III-III', and respectively, of FIG. 9. In the following description, an element previously described with reference to FIGS. 3 and 4A to 4C may be identified by the same reference number without repeating an overlapping description thereof.

Referring to FIGS. 9 and 10A to 10C, the first device isolation pattern 101 and a conductive pattern 105 may be provided in the trench TR penetrating the semiconductor substrate 100. A depth of the trench TR may be substantially equal to a thickness of the semiconductor substrate 100. The trench TR may have a gradually increasing width in a direction from the second surface 100b of the semiconductor substrate 100 toward the first surface 100a.

The first device isolation pattern 101 may be provided to conformally and partially fill the trench TR. The conductive pattern 105 may fill the entire portion of the trench TR, except the first device isolation pattern 101. A top surface of the conductive pattern 105 and a top surface of the first device isolation pattern 101 may be coplanar with the second surface 100b of the semiconductor substrate 100. A bottom surface of the conductive pattern 105 and a bottom surface of the first device isolation pattern 101 may be coplanar with the first surface 100a of the semiconductor substrate 100.

When viewed in a plan view, the conductive pattern 105 may be provided to have a grid structure. The conductive pattern 105 may be overlapped with the first and second extended portions GRa and GRb of the light-blocking layer GR. The conductive pattern 105 may be interposed between an adjacent pair of the unit pixels PX. The conductive pattern 105 may have a gradually increasing width in a direction from the second surface 100b of the semiconductor substrate 100 toward the first surface 100a. The conductive pattern 105 may be formed of or include at least one of conductive materials. As an example, the conductive pattern 105 may include n- or p-type poly silicon.

A first planarization layer 301 may be provided on the second surface 100b of the semiconductor substrate 100. The first planarization layer 301 may include a silicon oxide layer. The transparent conductive layer TEL may be provided on the first planarization layer 301. The vertical portion VP of the transparent conductive layer TEL described with reference to FIGS. 4A to 4C may be omitted.

Referring back to FIGS. 9 and 10C, the transparent conductive layer TEL may include contact portions CNT on the dummy region DR. When viewed in a plan view, the contact portion CNT may be provided between an adjacent pair of the dummy pixels DPX. The contact portions CNT may be provided to penetrate the first planarization layer 301 and to be in contact with the conductive pattern 105. The transparent conductive layer TEL may be electrically connected to the conductive pattern 105 through the contact portions CNT. On the active region AR, the transparent conductive layer TEL may be spaced apart from the conductive pattern 105 with the first planarization layer 301 interposed therebetween. In other words, the contact portions CNT may not be provided on the active region AR.

FIGS. 11, 12, 13, and 14A are sectional views, which are taken along line I-I' of FIG. 9 and illustrate a method of fabricating an image sensor according to example embodiments of the inventive concept. FIG. 14B is a sectional view taken along line III-IIII' of FIG. 9.

Figure 11:
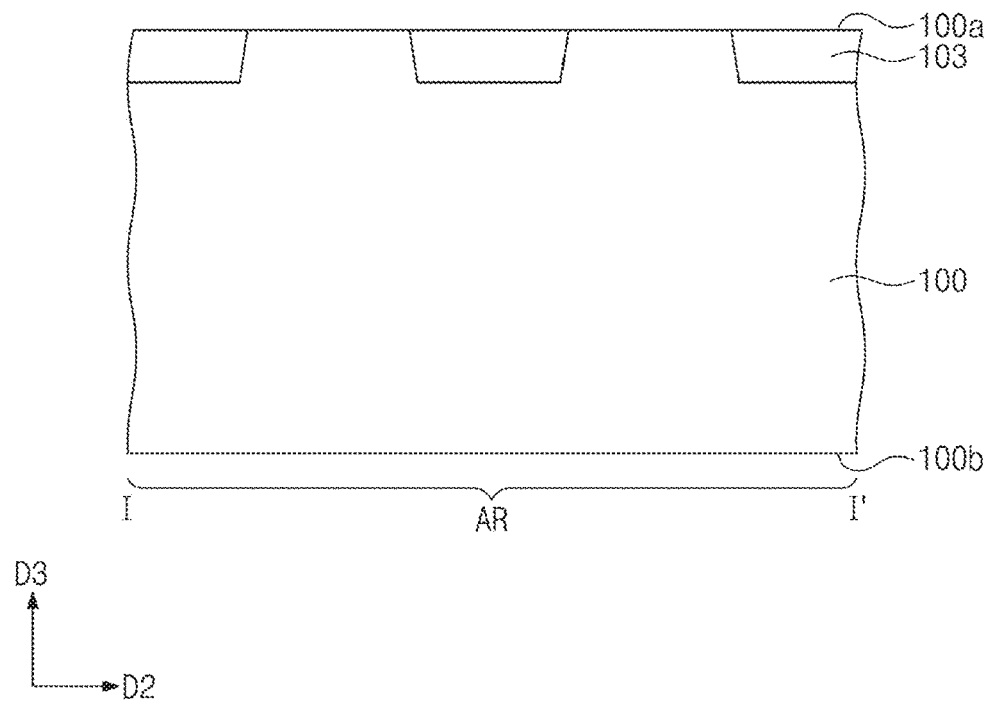
FIGS. 11, 12, 13, and 14A are sectional views, which are taken along line I-I' of FIG. 9 and illustrate a method of fabricating an image sensor according to example embodiments of the inventive concept.

Referring to FIGS. 9 and 11, the semiconductor substrate 100 having the first and second surfaces 100a and 100b opposite to each other may be provided. The second device isolation pattern 103 may be formed on the first surface 100a of the semiconductor substrate 100. The second device isolation pattern 103 may be formed to define active patterns.

Figure 12:
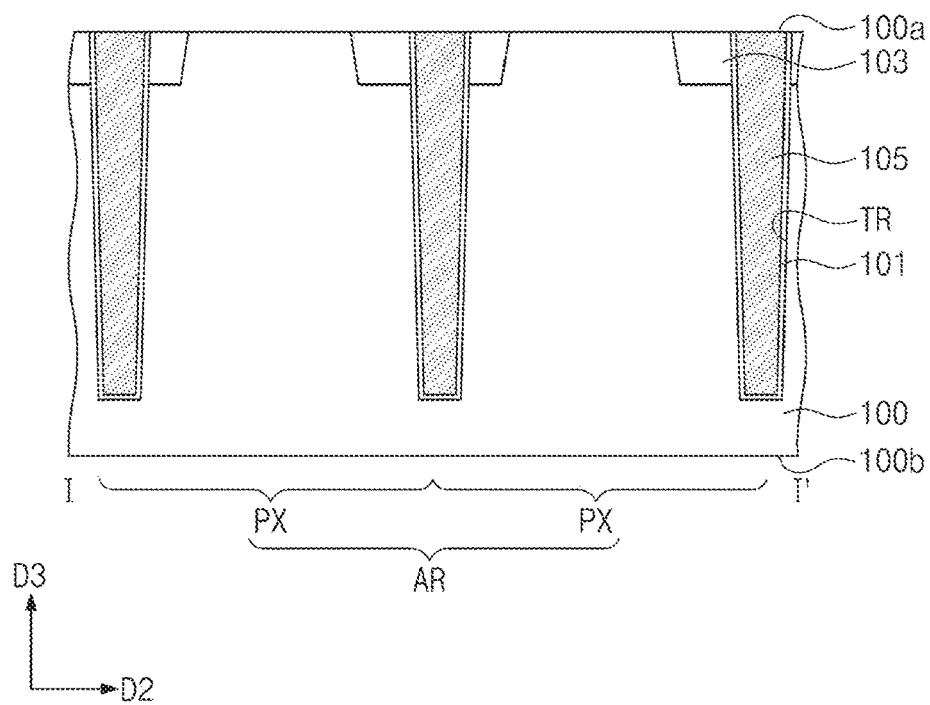

Referring to FIGS. 9 and 12, an etching process may be performed on the first surface 100a of the semiconductor substrate 100 to form the trench TR. The trench TR may be formed to have a gradually decreasing width in a direction from the first surface 100a of the semiconductor substrate 100 toward the second surface 100b. When viewed in a plan view, the trench TR may be formed to have a grid structure. A plurality of the unit pixels PX may be defined in the active region AR by the trench TR.

The first device isolation pattern 101 and the conductive pattern 105 may be formed to at least partially fill the trench TR. The formation of the first device isolation pattern 101 and the conductive pattern 105 may include conformally forming a device isolation layer to partially fill the trench TR, forming a conductive layer on the device isolation layer to at least partially fill the trench TR, and planarizing the device isolation layer and the conductive layer to expose the first surface 100a of the semiconductor substrate 100. As an example, the first device isolation pattern 101 may be formed of or include at least one of silicon oxide, silicon oxynitride, or silicon nitride. The conductive pattern 105 may be formed of or include an n- or p-type poly silicon layer.

Figure 13:
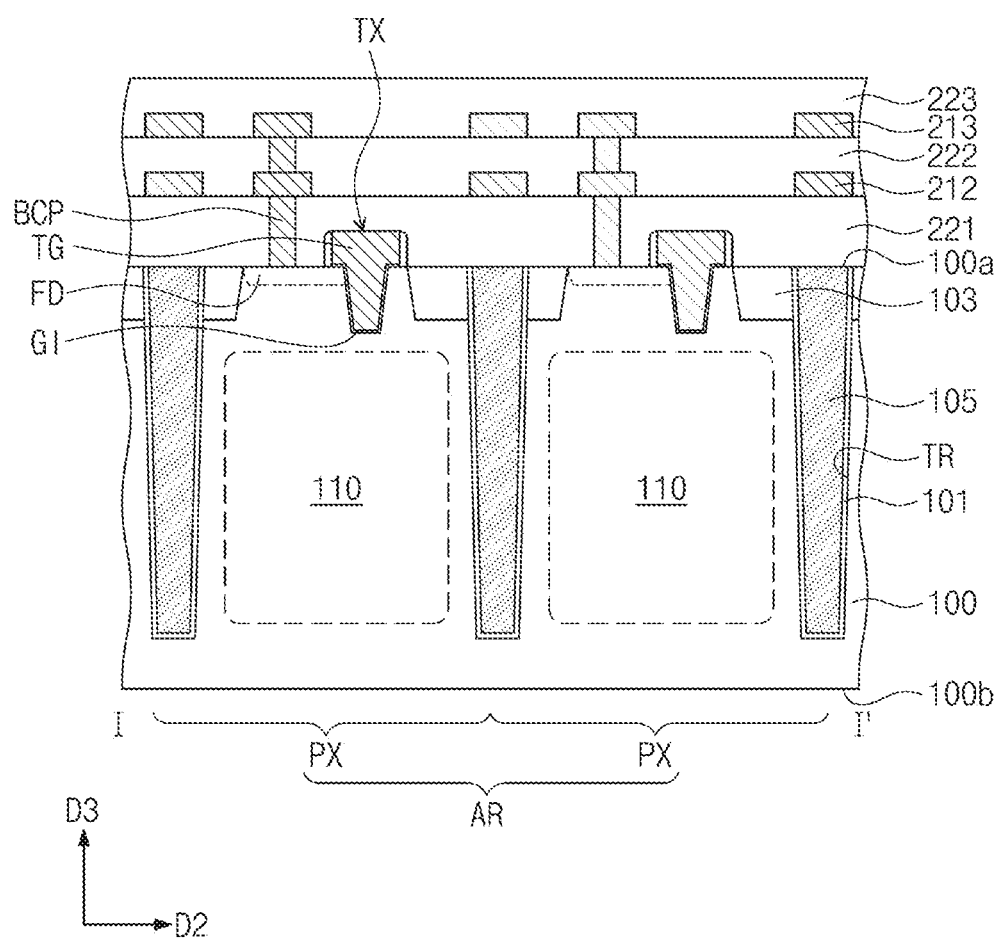

Referring to FIGS. 9 and 13, the floating diffusion region FD and the impurity region IR may be formed by doping each of the active patterns with impurities. The transfer transistors TX and the logic transistors RX, SX, and DX previously described with reference to FIG. 2 may be formed on the active patterns.

The first to third interlayered insulating layers 221, 222, and 223 may be formed on the first surface 100a of the semiconductor substrate 100. The first and second interconnection lines 212 and 213 may be formed in the second and third interlayered insulating layers 222 and 223, respectively. The lower contact plugs BCP may be formed.

Figure 14A:
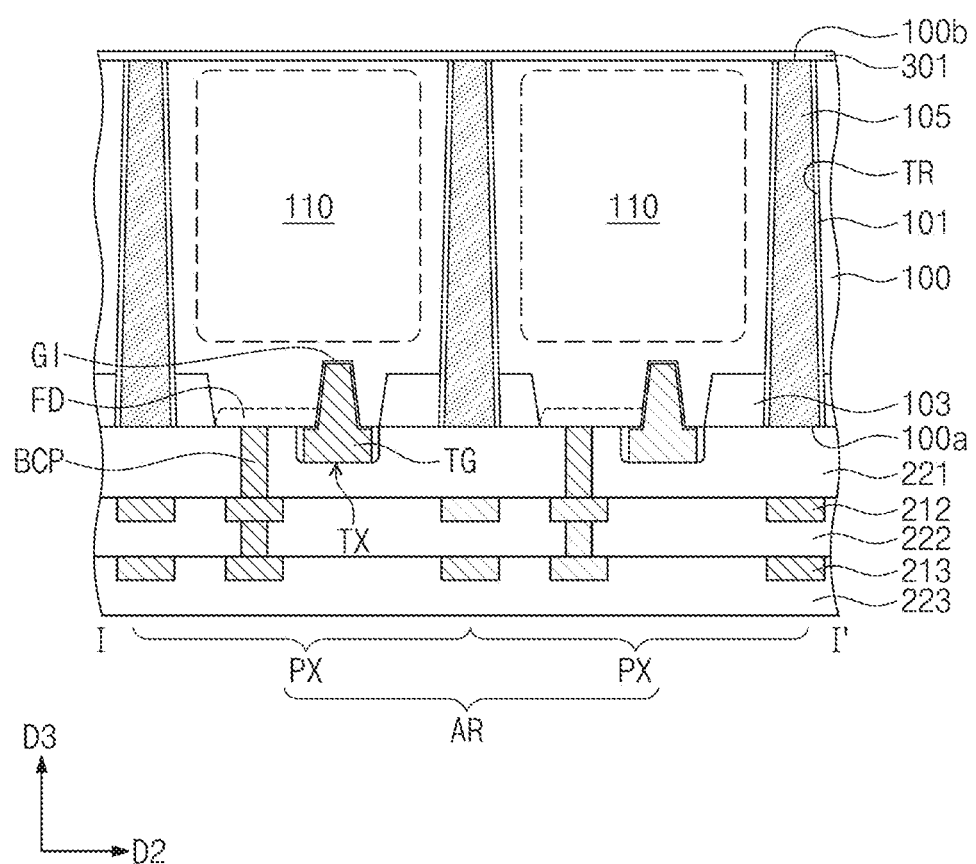
Figure 14B:
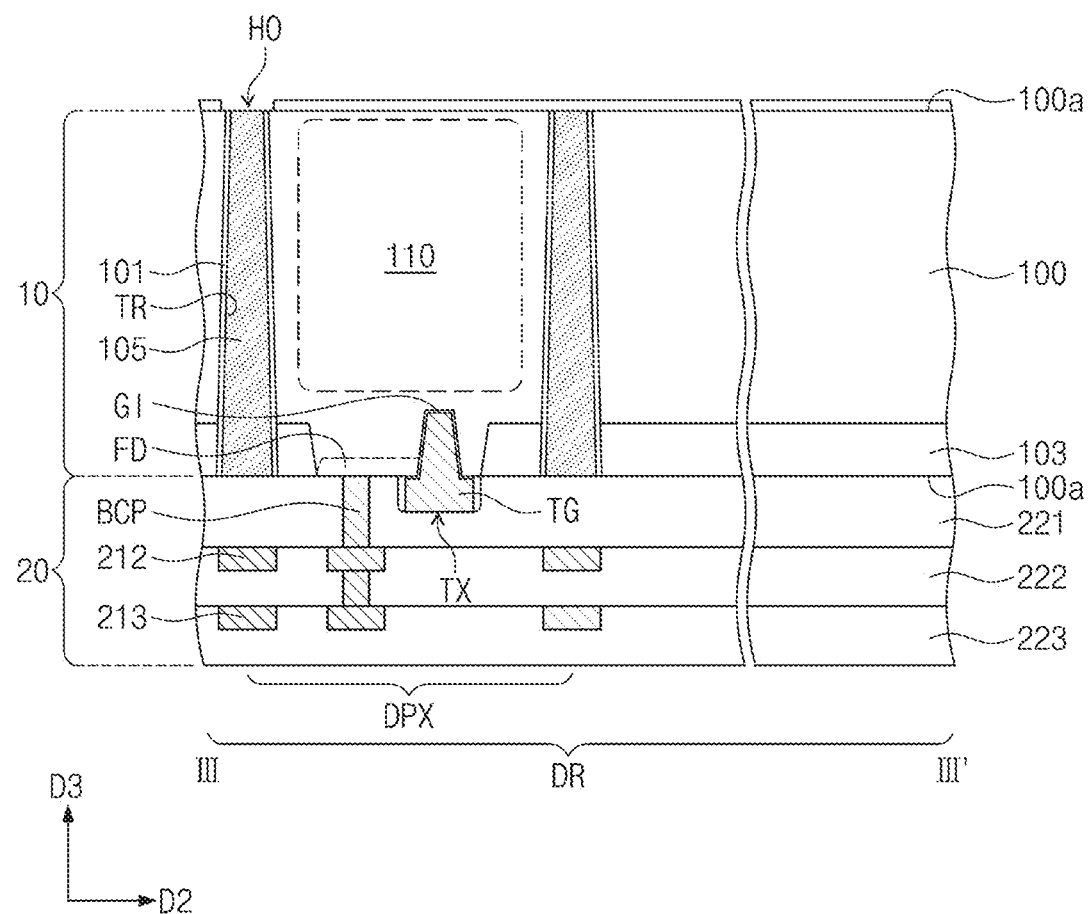
FIG. 14B is a sectional view taken along line III-IIII' of FIG. 9, according to example embodiments of the inventive concept.

Referring to FIGS. 9, 14A, and 14B, a planarization process may be performed on the second surface 100b of the semiconductor substrate 100 to expose the conductive pattern 105. The first planarization layer 301 may be formed on the second surface 100b of the semiconductor substrate 100.

The first planarization layer 301 may be formed to cover the exposed top surface of the conductive pattern 105.

The conductive pattern 105 on the dummy region DR may be patterned to form holes HO exposing the top surface of the conductive pattern 105. When viewed in a plan view, the hole HO may be formed between an adjacent pair of the dummy pixels DPX.

Referring back to FIGS. 9 and 10A to 10C, the transparent conductive layer TEL may be formed on the first planarization layer 301. The transparent conductive layer TEL may include the contact portions CNT filling the holes HO. The light-blocking layer GR may be formed on the transparent conductive layer TEL. The light-blocking layer GR may be formed to have a grid structure. The first to third color filters 303a, 303b, and 303c may be formed on the light-blocking layer GR. The first to third color filters 303a, 303b, and 303c may be formed on the unit pixels PX, respectively. The micro lenses 307 may be formed on the first to third color filters 303a, 303b, and 303c.

Figure 15A:
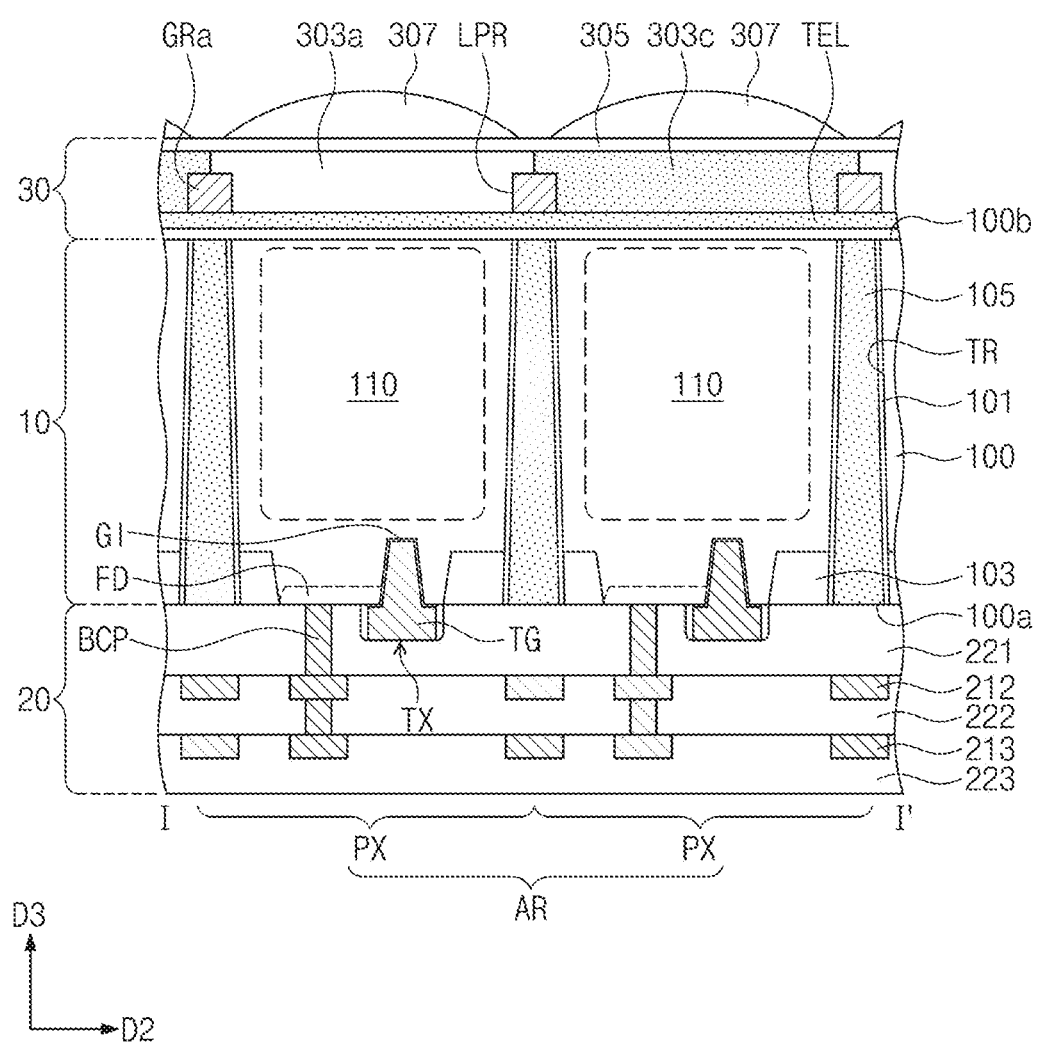
FIGS. 15A and 15B are sectional views, which are taken along lines I-I' and III-III', respectively, of FIG. 9 and illustrate an image sensor according to example embodiments of the inventive concept.
Figure 15B:
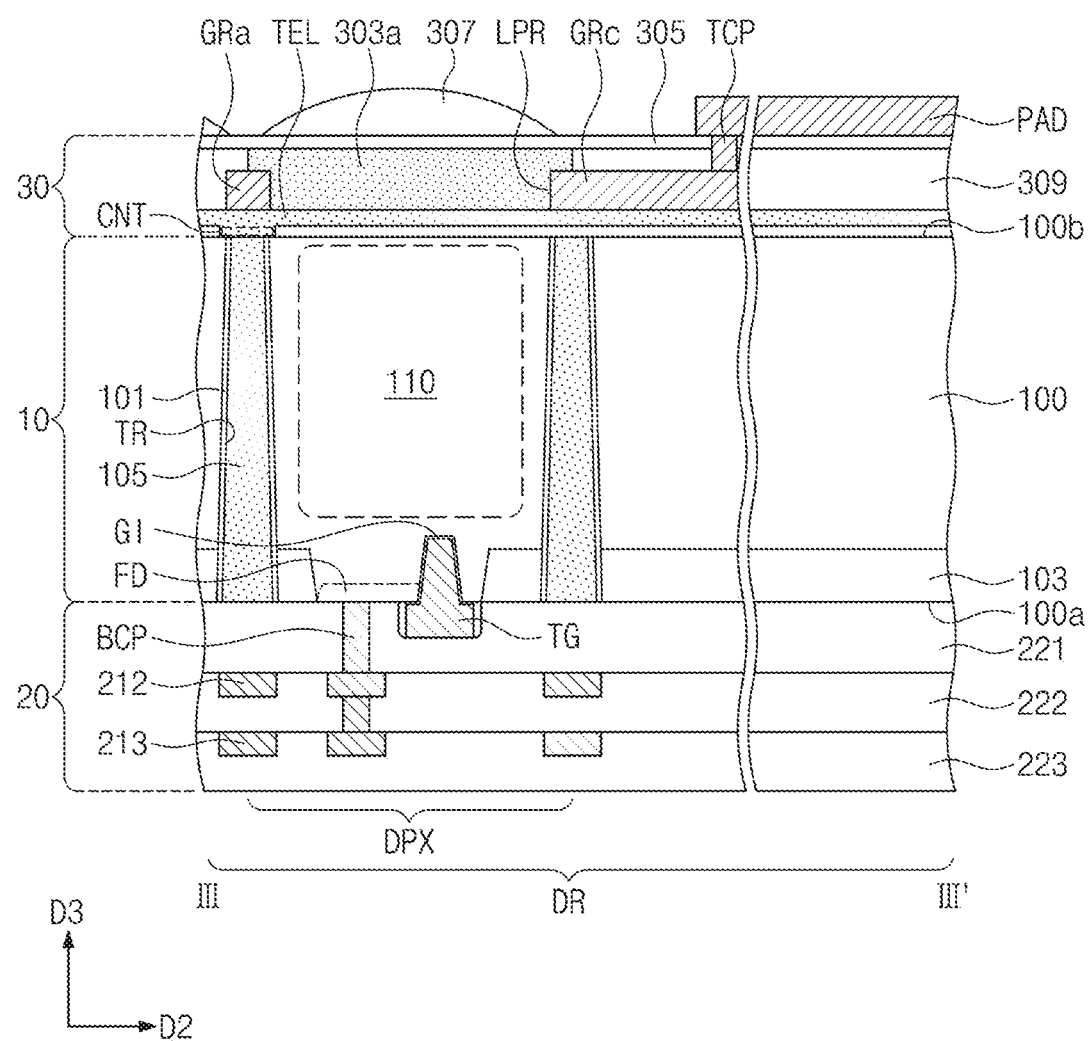

FIGS. 15A and 15B are sectional views, which are taken along lines I-I' and respectively, of FIG. 9 and illustrate an image sensor according to example embodiments of the inventive concept. In the following description, an element previously described with reference to FIGS. 9 and 10A to 10C may be identified by the same reference number without repeating an overlapping description thereof.

Referring to FIGS. 9, 15A, and 15B, the conductive pattern 105 may be formed of or include a transparent conductive material. For example, the conductive pattern 105 may be formed of or include at least one of indium tin oxide (ITO), indium zinc oxide (IZO), zinc oxide (ZnO), or organic transparent conductive materials. In some embodiments, the conductive pattern 105 may include the same material as the transparent conductive layer TEL.

In an image sensor according to some embodiments of the inventive concept, a negative voltage is applied to a transparent conductive layer provided on unit pixels, and in this case, positive charges generated in the unit pixels can be effectively removed through the transparent conductive layer. This may make it possible to improve a dark current property of an image sensor.

While example embodiments of the inventive concepts have been particularly shown and described, it will be understood by one of ordinary skill in the art that variations in form and detail may be made therein without departing from the spirit and scope of the attached claims.

What is claimed is:

1. An image sensor, comprising:
   a substrate comprising an active region and a dummy region;
   a plurality of unit pixels on the active region;
   a transparent conductive layer on a first surface of the substrate;
   a light-blocking layer on the transparent conductive layer and electrically connected to the transparent conductive layer, the light-blocking layer having a grid structure adjacent light transmission regions; and
   a pad electrically connected to the light-blocking layer, wherein the pad is on the dummy region,
   wherein a vertical portion of the transparent conductive layer is in a trench that is adjacent at least one of the plurality of unit pixels, and
   wherein a sidewall of the vertical portion of the transparent conductive layer in the trench is slanted with respect to a horizontal portion of the transparent conductive layer that is substantially parallel to the first surface.

2. The image sensor of claim 1, further comprising:
a device isolation pattern in the trench that is adjacent at least one of the plurality of unit pixels.

3. The image sensor of claim 2, wherein the device isolation pattern is interposed between the first surface and the transparent conductive layer.

4. The image sensor of claim 2, wherein a depth of the trench is less than a thickness of the substrate.

5. The image sensor of claim 2, further comprising:
a conductive pattern in the trench; and
a planarization layer between the first surface and the transparent conductive layer,
wherein the transparent conductive layer comprises a contact portion which penetrates the planarization layer on the dummy region, and
wherein the contact portion is electrically connected to the conductive pattern.

6. The image sensor of claim 1, wherein the vertical portion is vertically overlapped with the grid structure of the light-blocking layer.

7. The image sensor of claim 1, further comprising:
color filters on the light-blocking layer; and
micro lenses on respective ones of the color filters.

8. The image sensor of claim 1, wherein each of the plurality of unit pixels comprises a photoelectric conversion region.

9. The image sensor of claim 1, further comprising:
transfer transistors and logic transistors on a second surface of the substrate; and
interconnection lines in an interlayered insulating layer on the second surface,
wherein the interconnection lines are electrically connected to the transfer and logic transistors.

10. An image sensor, comprising:
a substrate comprising a first surface and a second surface opposite to the first surface;
a first device isolation pattern on the first surface, the first device isolation pattern in a trench adjacent a plurality of unit pixels in the substrate;
a transparent conductive layer on the first device isolation pattern; and
a light-blocking layer on the transparent conductive layer,
wherein a depth of the trench is less than a thickness of the substrate,
wherein the transparent conductive layer includes a horizontal portion on the first surface and a vertical portion extending from the horizontal portion into the trench,
wherein the first device isolation pattern is between the vertical portion and the trench, and covers a bottom of the vertical portion, and
wherein the light-blocking layer is electrically connected to the horizontal portion.

11. The image sensor of claim 10,
wherein the light-blocking layer has a grid structure adjacent light transmission regions, and
wherein the light transmission regions are vertically overlapped with the plurality of unit pixels, respectively.

12. The image sensor of claim 11, further comprising:
color filters on the light-blocking layer; and
micro lenses on respective ones of the color filters.

13. The image sensor of claim 10, wherein a negative voltage is applied from the horizontal portion to the vertical portion of the transparent conductive layer through the light-blocking layer.

14. The image sensor of claim 10, further comprising:
a second device isolation pattern on the second surface to define a plurality of active patterns; and
an interconnection line provided in an interlayered insulating layer on the second surface and electrically connected to the active pattern.

15. An image sensor, comprising:
a substrate comprising a first surface and a second surface opposite to the first surface;
a trench defining a plurality of unit pixels in the substrate; and
a transparent conductive layer on the first surface of the substrate,
wherein the transparent conductive layer comprises a vertical portion in the trench, and
wherein a width of the vertical portion adjacent to the first surface is greater than a width of the vertical portion that is adjacent to and below the second surface of the substrate.

16. The image sensor of claim 15, further comprising:
a light-blocking layer on the transparent conductive layer and electrically connected to the transparent conductive layer,
wherein the light-blocking layer has a grid structure adjacent light transmission regions, which are vertically overlapped with the plurality of unit pixels, respectively, and
wherein the vertical portion is vertically overlapped with the grid structure of the light-blocking layer.

17. The image sensor of claim 16, further comprising:
a pad provided on a peripheral region of the substrate and electrically connected to the light-blocking layer.

18. The image sensor of claim 15, wherein the transparent conductive layer further comprises:
a horizontal portion parallel to the first surface.

19. The image sensor of claim 15, further comprising:
a device isolation pattern between the substrate and the transparent conductive layer,
wherein the device isolation pattern at least partially fills the trench.

* * * * *